(12) United States Patent  
Yamazaki et al.

(10) Patent No.: US 8,519,619 B2
(45) Date of Patent: Aug. 27, 2013

(54) LIGHT EMITTING DEVICE AND METHOD OF MANUFACTURING THE SAME

(75) Inventors: Shunpei Yamazaki, Tokyo (JP); Satoshi Seo, Kanagawa (JP); Hideaki Kuwabara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 193 days.

(21) Appl. No.: 13/234,416

(22) Filed: Sep. 16, 2011

(65) Prior Publication Data

US 2012/0086042 A1 Apr. 12, 2012

Related U.S. Application Data

(60) Continuation of application No. 12/538,563, filed on Aug. 10, 2009, now Pat. No. 8,021,204, which is a division of application No. 10/419,640, filed on Apr. 21, 2003, now Pat. No. 7,579,771.

(30) Foreign Application Priority Data

Apr. 23, 2002 (JP) ................. 2002-121522

(51) Int. Cl.
*H01J 1/62* (2006.01)
*H01J 63/04* (2006.01)

(52) U.S. Cl.
USPC .......................... 313/506; 313/504

(58) Field of Classification Search
USPC .................. 313/498–512
See application file for complete search history.

(56) References Cited

U.S. PATENT DOCUMENTS

| 4,411,735 A | 10/1983 | Belani |
| 5,047,687 A | 9/1991 | VanSlyke |
| 5,049,780 A | 9/1991 | Dobrowolski et al. |
| 5,063,327 A | 11/1991 | Brodie et al. |

(Continued)

FOREIGN PATENT DOCUMENTS

| CN | 1237258 | 12/1999 |
| EP | 0 717 445 A2 | 6/1996 |

(Continued)

OTHER PUBLICATIONS

Kamins, T., *Polycrystalline Silicon for Integrated Circuits and Displays*, $2^{nd}$ ed., Kluwer Academic Publishers, 1998, pp. 301-302.

(Continued)

*Primary Examiner* — Anh Mai
*Assistant Examiner* — Zachary J Snyder
(74) *Attorney, Agent, or Firm* — Husch Blackwell LLP

(57) ABSTRACT

A light-emitting device structured so as to increase the amount of light taken out in a certain direction is provided as well as a method of manufacturing this light emitting device. As a result of etching treatment, an upper edge portion of an insulator (19) is curved to have a radius of curvature, a slope is formed along the curved face while partially exposing layers (18c and 18d) of a first electrode, and a layer (18b) of the first electrode is exposed in a region that serves as a light emitting region. Light emitted from an organic compound layer (20) is reflected by the slope of the first electrode (layers 18c and 18d) to increase the total amount of light taken out in the direction indicated by the arrow in FIG. 1A.

19 Claims, 13 Drawing Sheets

(56) References Cited

U.S. PATENT DOCUMENTS

| | | |
|---|---|---|
| 5,232,549 A | 8/1993 | Cathey et al. |
| 5,640,067 A | 6/1997 | Yamauchi et al. |
| 5,684,365 A | 11/1997 | Tang et al. |
| 5,742,129 A | 4/1998 | Nagayama et al. |
| 5,786,664 A | 7/1998 | Liu |
| 5,839,456 A | 11/1998 | Han |
| 5,962,962 A | 10/1999 | Fujita et al. |
| 6,037,712 A | 3/2000 | Codama et al. |
| 6,091,195 A | 7/2000 | Forrest et al. |
| 6,107,158 A | 8/2000 | Zheng et al. |
| 6,114,715 A | 9/2000 | Hamada |
| 6,136,624 A | 10/2000 | Kemmochi et al. |
| 6,194,837 B1 | 2/2001 | Ozawa |
| 6,222,315 B1 | 4/2001 | Yoshizawa et al. |
| 6,306,559 B1 | 10/2001 | Tanamura et al. |
| 6,320,311 B2 | 11/2001 | Nakaya et al. |
| 6,380,687 B1 | 4/2002 | Yamazaki |
| 6,384,427 B1 | 5/2002 | Yamazaki et al. |
| 6,396,208 B1 | 5/2002 | Oda et al. |
| 6,403,289 B1 | 6/2002 | Tanaka et al. |
| 6,406,804 B1 | 6/2002 | Higashi et al. |
| 6,420,834 B2 | 7/2002 | Yamazaki et al. |
| 6,433,487 B1 | 8/2002 | Yamazaki |
| 6,441,873 B2 | 8/2002 | Young |
| 6,445,005 B1 | 9/2002 | Yamazaki et al. |
| 6,462,722 B1 | 10/2002 | Kimura et al. |
| 6,475,836 B1 | 11/2002 | Suzawa et al. |
| 6,501,217 B2 | 12/2002 | Beierlein et al. |
| 6,515,310 B2 | 2/2003 | Yamazaki et al. |
| 6,518,700 B1 | 2/2003 | Friend et al. |
| 6,522,315 B2 | 2/2003 | Ozawa et al. |
| 6,528,824 B2 | 3/2003 | Yamagata et al. |
| 6,538,374 B2 | 3/2003 | Hosokawa |
| 6,538,390 B2 | 3/2003 | Fujita et al. |
| 6,555,968 B2 | 4/2003 | Yamazaki et al. |
| 6,597,111 B2 | 7/2003 | Silvernail et al. |
| 6,597,121 B2 | 7/2003 | Imura |
| 6,599,783 B2 | 7/2003 | Takatoku |
| 6,605,826 B2 | 8/2003 | Yamazaki et al. |
| 6,608,353 B2 | 8/2003 | Miyazaki et al. |
| 6,608,449 B2 | 8/2003 | Fukunaga |
| 6,614,085 B2 | 9/2003 | Hu |
| 6,614,174 B1 | 9/2003 | Urabe et al. |
| 6,624,571 B1 | 9/2003 | Toyoyasu et al. |
| 6,628,065 B2 | 9/2003 | Araki et al. |
| 6,641,933 B1 | 11/2003 | Yamazaki et al. |
| 6,689,492 B1 | 2/2004 | Yamazaki et al. |
| 6,690,034 B2 | 2/2004 | Fujimoto et al. |
| 6,692,845 B2 | 2/2004 | Maruyama et al. |
| 6,699,739 B2 | 3/2004 | Yamazaki et al. |
| 6,717,181 B2 | 4/2004 | Murakami et al. |
| 6,720,572 B1 | 4/2004 | Jackson et al. |
| 6,737,306 B2 | 5/2004 | Yamazaki et al. |
| 6,739,931 B2 | 5/2004 | Yamazaki et al. |
| 6,740,457 B2 | 5/2004 | Takizawa |
| 6,750,618 B2 | 6/2004 | Yamazaki et al. |
| 6,768,534 B2 | 7/2004 | Iwase et al. |
| 6,787,796 B2 | 9/2004 | Do et al. |
| 6,788,356 B2 | 9/2004 | Song |
| 6,798,132 B2 | 9/2004 | Satake |
| 6,805,977 B2 | 10/2004 | Sotoyama et al. |
| 6,831,408 B2 | 12/2004 | Hirano et al. |
| 6,839,045 B2 | 1/2005 | Ozawa et al. |
| 6,858,878 B2 | 2/2005 | Yamazaki et al. |
| 6,869,635 B2 | 3/2005 | Kobayashi |
| 6,881,501 B2 | 4/2005 | Yudasaka |
| 6,894,312 B2 | 5/2005 | Yamazaki et al. |
| 6,956,324 B2 | 10/2005 | Yamazaki |
| 6,958,490 B2 | 10/2005 | Okamoto et al. |
| 6,977,463 B2 | 12/2005 | Sato |
| 6,995,511 B2 | 2/2006 | Yamazaki et al. |
| 7,015,503 B2 | 3/2006 | Seki et al. |
| 7,098,602 B2 | 8/2006 | Yamazaki et al. |
| 7,112,374 B2 | 9/2006 | Yamazaki et al. |
| 7,180,483 B2 | 2/2007 | Kimura et al. |
| 7,187,121 B2 | 3/2007 | Hasegawa et al. |
| 7,190,111 B2 | 3/2007 | Lee et al. |
| 7,214,959 B2 | 5/2007 | Seki et al. |
| 7,221,339 B2 | 5/2007 | Ozawa et al. |
| 7,253,793 B2 | 8/2007 | Ozawa et al. |
| 7,273,801 B2 | 9/2007 | Seki et al. |
| 7,301,276 B2 | 11/2007 | Yamazaki et al. |
| 7,332,859 B2 | 2/2008 | Hasegawa et al. |
| 7,358,531 B2 | 4/2008 | Koyama |
| 7,402,948 B2 | 7/2008 | Yamazaki et al. |
| 7,482,182 B2 | 1/2009 | Yamazaki et al. |
| 7,663,305 B2 | 2/2010 | Yamazaki et al. |
| 7,786,496 B2 | 8/2010 | Yamazaki et al. |
| 7,897,979 B2 | 3/2011 | Yamazaki et al. |
| 2001/0009283 A1 | 7/2001 | Arao et al. |
| 2001/0011868 A1 | 8/2001 | Fukunaga et al. |
| 2001/0013913 A1 | 8/2001 | Young |
| 2001/0020922 A1 | 9/2001 | Yamazaki et al. |
| 2001/0026125 A1 | 10/2001 | Yamazaki et al. |
| 2001/0026257 A1* | 10/2001 | Kimura ............................ 345/87 |
| 2001/0046003 A1 | 11/2001 | Song |
| 2001/0054867 A1 | 12/2001 | Kubota |
| 2002/0025643 A1 | 2/2002 | Akram et al. |
| 2002/0036462 A1 | 3/2002 | Hirano |
| 2002/0039730 A1 | 4/2002 | Morii |
| 2002/0043932 A1 | 4/2002 | Kawashima |
| 2002/0045066 A1 | 4/2002 | Beierlein et al. |
| 2002/0050776 A1* | 5/2002 | Kubota et al. ................. 313/309 |
| 2002/0050795 A1 | 5/2002 | Imura |
| 2002/0063287 A1 | 5/2002 | Yamazaki et al. |
| 2002/0063515 A1 | 5/2002 | Goto |
| 2002/0121860 A1 | 9/2002 | Seo et al. |
| 2003/0062826 A1 | 4/2003 | Seo et al. |
| 2003/0193493 A1 | 10/2003 | Ozawa |
| 2003/0201447 A1 | 10/2003 | Yamazaki et al. |
| 2003/0201716 A1 | 10/2003 | Yamazaki et al. |
| 2003/0227021 A1 | 12/2003 | Yamazaki et al. |
| 2003/0231273 A1 | 12/2003 | Kimura et al. |
| 2004/0012747 A1 | 1/2004 | Yamazaki et al. |
| 2004/0171182 A1 | 9/2004 | Yamazaki et al. |
| 2004/0195964 A1 | 10/2004 | Yamazaki et al. |
| 2005/0001541 A1 | 1/2005 | Yamazaki et al. |
| 2005/0012445 A1 | 1/2005 | Yamazaki et al. |
| 2005/0073243 A1 | 4/2005 | Yamazaki et al. |
| 2005/0162092 A1 | 7/2005 | Yamazaki et al. |
| 2005/0186403 A1 | 8/2005 | Seki et al. |
| 2005/0247938 A1 | 11/2005 | Okamoto et al. |
| 2006/0014465 A1 | 1/2006 | Yamazaki |
| 2006/0082300 A1 | 4/2006 | Yamazaki et al. |
| 2006/0084213 A1 | 4/2006 | Yamazaki et al. |
| 2006/0267030 A1 | 11/2006 | Yamazaki et al. |
| 2006/0273995 A1 | 12/2006 | Ozawa et al. |
| 2006/0273996 A1 | 12/2006 | Ozawa et al. |
| 2006/0279491 A1 | 12/2006 | Ozawa et al. |
| 2007/0007870 A1 | 1/2007 | Yamazaki et al. |
| 2007/0096641 A1 | 5/2007 | Hasegawa et al. |
| 2008/0252207 A1 | 10/2008 | Yamazaki et al. |

FOREIGN PATENT DOCUMENTS

| | | |
|---|---|---|
| EP | 0 781 075 A1 | 6/1997 |
| EP | 0 895 219 A1 | 2/1999 |
| EP | 0 917 127 A1 | 5/1999 |
| EP | 0 989 778 A1 | 3/2000 |
| EP | 1 065 723 A2 | 1/2001 |
| EP | 1 085 576 A2 | 3/2001 |
| EP | 1 087 448 A2 | 3/2001 |
| EP | 1081767 A2 * | 3/2001 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 619 654 A1 | 1/2006 |
| EP | 1 793 650 A2 | 6/2007 |
| EP | 1 830 342 A2 | 9/2007 |
| EP | 1 830 343 A2 | 9/2007 |
| EP | 1 830 344 A2 | 9/2007 |
| JP | 9-63771 | 3/1997 |
| JP | 10-289784 | 10/1998 |

| | | |
|---|---|---|
| JP | 11-307264 | 11/1999 |
| JP | 11-329741 | 11/1999 |
| JP | 11-339970 | 12/1999 |
| JP | 2000-77181 | 3/2000 |
| JP | 2000-91083 | 3/2000 |
| JP | 2000-193994 | 7/2000 |
| JP | 2000-269473 | 9/2000 |
| JP | 2001-43980 | 2/2001 |
| JP | 2001-43981 | 2/2001 |
| JP | 2001-52870 | 2/2001 |
| JP | 2001-154001 | 6/2001 |
| JP | 2001-332388 | 11/2001 |
| JP | 2001-338771 | 12/2001 |
| JP | 2001-351787 | 12/2001 |
| JP | 2002-8566 | 1/2002 |
| JP | 2002-15859 | 1/2002 |
| JP | 2002-15860 | 1/2002 |
| JP | 2002-71902 | 3/2002 |
| JP | 2002-132186 | 5/2002 |
| JP | 2002-198182 | 7/2002 |
| JP | 2002-208491 | 7/2002 |
| JP | 2002-352963 | 12/2002 |
| JP | 2003-17272 | 1/2003 |
| JP | 2003-17273 | 1/2003 |
| WO | WO 99/39393 A1 | 8/1999 |
| WO | WO 99/43028 A1 | 8/1999 |
| WO | WO 99/59379 A2 | 11/1999 |
| WO | WO 00/16361 A1 | 3/2000 |
| WO | WO 01/08240 A1 | 2/2001 |
| WO | WO 01/63975 A1 | 8/2001 |

OTHER PUBLICATIONS

*Merriam-Webster's Collegiate Dictionary*, 10$^{th}$ edition, 1998, p. 653.
*Merriam-Webster's Collegiate Dictionary*, 10$^{th}$ edition, 1998, p. 827.
Adamovich, V. et al, "TiN as an Anode Material for Organic Light-Emitting Diodes," Advanced Materials, vol. 11, No. 9, 1999, pp. 727-730.
Claims as allowed in Notice of Allowance dated May 4, 2006, re U.S. Appl. No. 10/421,238, (now US 7,786,496 B2) to Yamazaki et al.
Pending claims as filed in Amendment D dated May 22, 2006, re U.S. Appl. No. 10/454,124, (now US 7,897,979 B2) to Yamazaki et al.
Office Action re Chinese patent application No. CN 200310028471. X, dated Nov. 2, 2007 (with English translation).

* cited by examiner

LIGHT EMITTING REGION

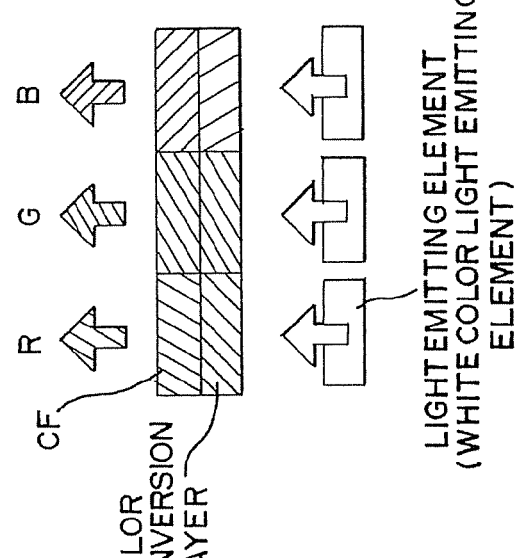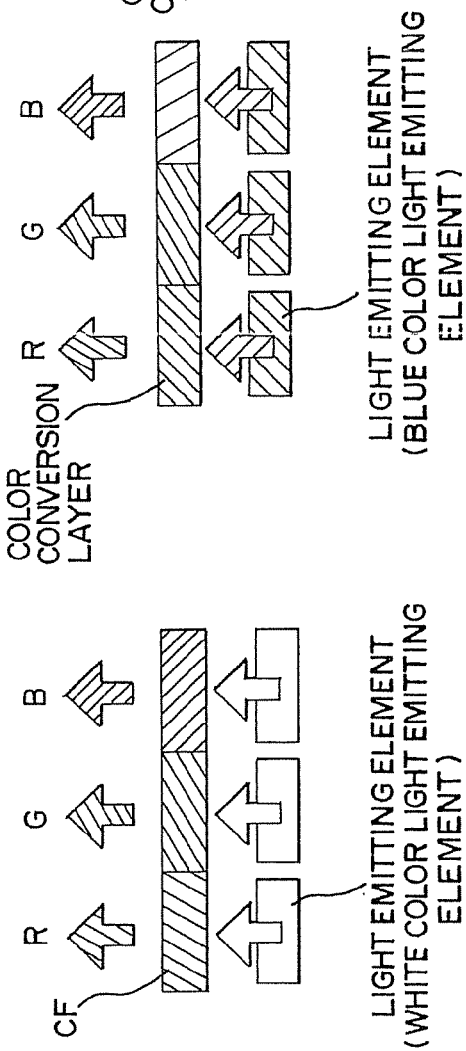

LIGHT EMITTING REGION
60

LIGHT EMITTING REGION

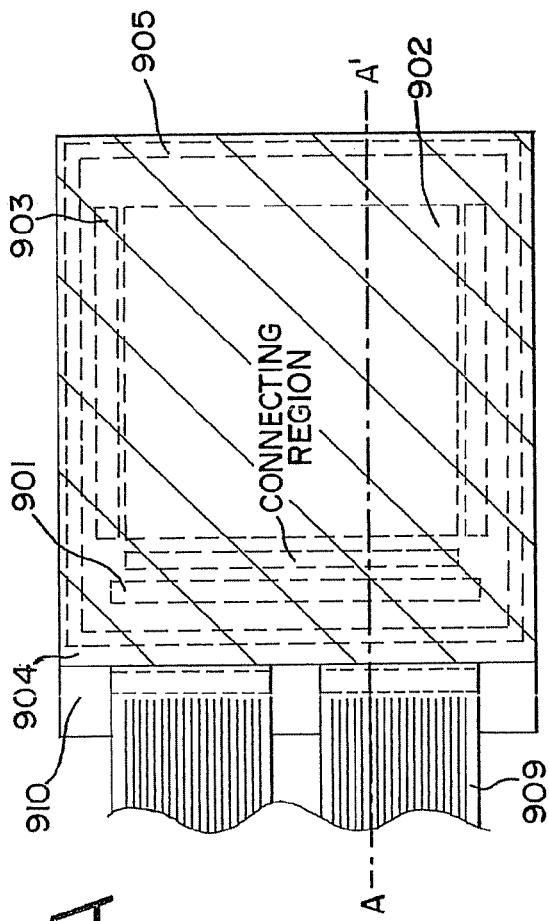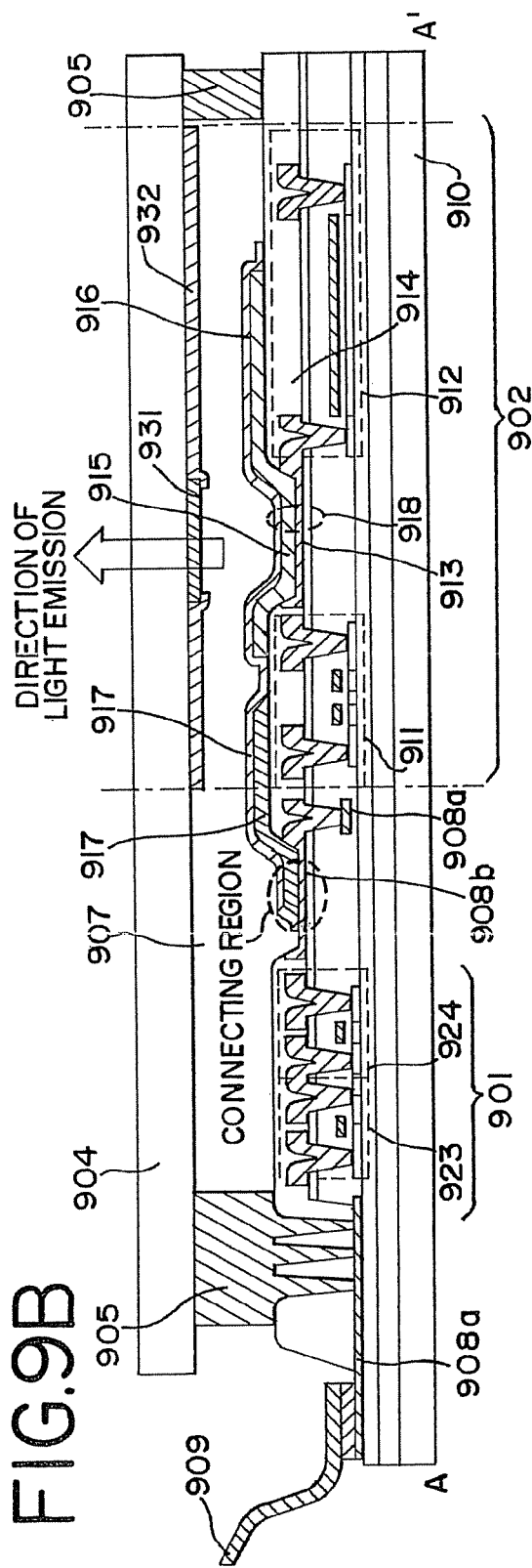
FIG.9A
FIG.9B

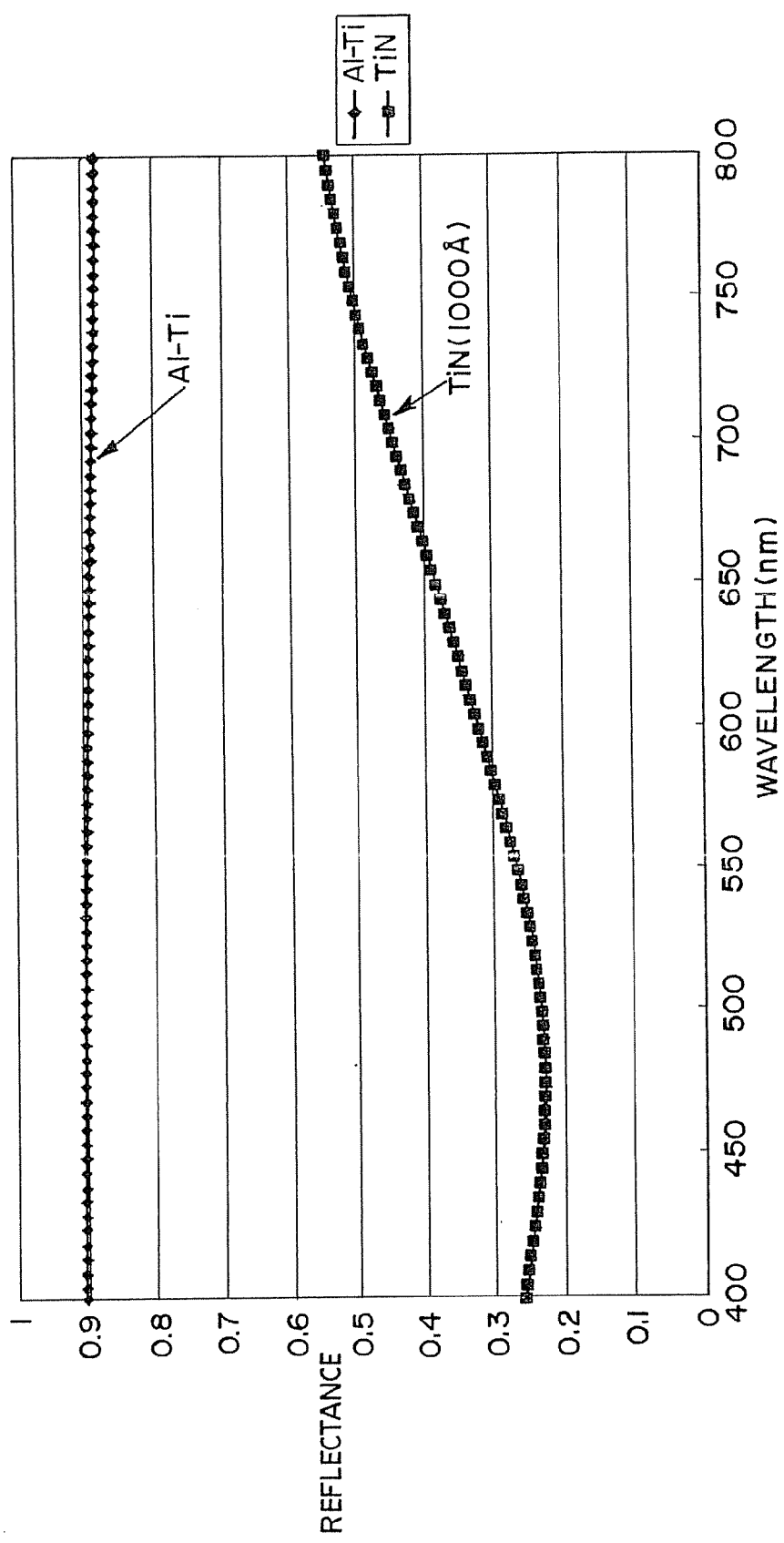

LIGHT EMITTING DEVICE AND METHOD OF MANUFACTURING THE SAME

This application is a continuation of U.S. application Ser. No. 12/538,563 filed on Aug. 10, 2009 now U.S. Pat. No. 8,021,204 which is a divisional of U.S. application Ser. No. 10/419,640 filed on Apr. 21, 2003 (now U.S. Pat. No. 7,579,771 issued Aug. 25, 2009).

BACKGROUND OF THE INVENTION

1. Field of the Invention

The present invention relates to a light emitting device with a light emitting element that emits fluorescent light or phosphorescent light upon application of electric field to a pair of electrodes of the element which sandwich a layer containing an organic compound (hereinafter, an organic compound film), and to a method of manufacturing the light emitting device. In this specification, the term light emitting device includes an image display device, a light emitting device and a light source (including illuminating device). Also, the following modules are included in the definition of the light emitting device: a module obtained by attaching to a light emitting device a connector such as an FPC (flexible printed circuit; terminal portion), a TAB (tape automated bonding) tape, or a TCP (tape carrier package); a module in which a printed wiring board is provided at an end of the TAB tape or the TCP; and a module in which an IC (integrated circuit) is directly mounted to a light emitting element by the COG (chip on glass) system.

2. Description of the Related Art

Light emitting elements, which employ organic compounds as light emitting member and are characterized by their thinness and light weight, fast response, and direct current low voltage driving, are expected to develop into next-generation flat panel displays. Among display devices, ones having light emitting elements arranged to form a matrix shape are considered to be particularly superior to the conventional liquid crystal display devices for their wide viewing angle and excellent visibility.

It is said that light emitting elements emit light through the following mechanism: a voltage is applied between a pair of electrodes that sandwich an organic compound layer, electrons injected from the cathode and holes injected from the anode are re-combined at the luminescent center of the organic compound layer to form molecular excitons, and the molecular excitons return to the base state while releasing energy to cause the light emitting element to emit light. Known as excitation states are singlet excitation and triplet excitation, and it is considered that luminescence can be conducted through either one of those excitation states.

Such light emitting devices having light emitting elements arranged to form a matrix can employ passive matrix driving (simple matrix light emitting devices), active matrix driving (active matrix light emitting devices), or other driving methods. However, if the pixel density is increased, active matrix light emitting devices in which each pixel (or each dot) has a switch are considered as advantageous because they can be driven with low voltage.

Organic compounds for forming a layer containing an organic compound (strictly speaking, light emitting layer), which is the center of a light emitting element, are classified into low molecular weight materials and polymeric (polymer) materials. Both types of materials are being studied but polymeric materials are the ones that are attracting attention because they are easier to handle and have higher heat resistance than low molecular weight materials.

The conventional active matrix type light emitting device has the structure comprising a light emitting element in which an electrode electrically connected with ITT on a substrate is formed as an anode, an organic compound layer is formed thereon, and cathode is formed thereon. And light generated at the organic compound layer can be observed at the TFT side through the anode that is a transparent electrode.

There has been a problem in the structure that an opening ratio is restricted depending on an arrangement of TFT and wirings in a pixel portion when definition is to be improved.

SUMMARY OF THE INVENTION

Therefore, manufactured in the present invention is an active matrix light emitting device that has a light emitting element with a structure called an upward emission structure. In the upward emission structure, a TFT side electrode which is electrically connected to a TFT on a substrate serves as an anode, a layer containing an organic compound is formed on the anode, and a cathode that is a transparent electrode is formed on the layer containing an organic compound.

Compared to the downward emission structure, the number of material layers through which light emitted from the organic compound-containing layer passes is smaller in the upward emission structure and stray light caused between material layers of different refractive indexes is accordingly reduced.

Not all of light generated in the organic compound layer are taken out in the direction toward the TFT from the transparent electrode serving as the cathode. For example, light emitted in the lateral direction (the direction parallel to the substrate face) is not taken out and therefore is a loss. An object of the present invention is to provide a light emitting device structured so as to increase the amount of light which is taken out in a certain direction after emitted from a light emitting element, as well as a method of manufacturing this light emitting device.

A problem of the upward emission structure is that its transparent electrode has high film resistance. The film resistance becomes even higher when the thickness of the transparent electrode is reduced. When the transparent electrode that serves as an anode or a cathode is high in film resistance, a voltage drop makes the intra-plane electric potential distribution uneven and the luminance becomes fluctuated among light emitting elements. Another object of the present invention is therefore to provide a light emitting device structured so as to lower the film resistance of a transparent electrode in a light emitting element, as well as a method of manufacturing the light emitting device. Still another object of the present invention is to provide an electric appliance that uses this light emitting device as its display unit.

In the present invention, a first electrode is formed from a laminate of metal layers and the edge of the first electrode is covered with an insulator (also called as a bank or a partition wall). Using the insulator as a mask, the center of the first electrode is etched in a self-aligning manner so that the center is thinned and a level difference is formed in the edge while a part of the insulator is also etched. As a result of this etching, the center of the first electrode obtains a thin, flat surface and the edge of the first electrode that is covered with the insulator becomes thicker than the center, thereby giving the first electrode a concave shape. On the first electrode, a layer containing an organic compound and a second electrode are formed to complete a light emitting element.

The present invention is for increasing the amount of light taken out in a certain direction (a direction in which light passes the second electrode) by reflecting or collecting light emitted in the lateral direction at the slope formed in the stepped portion of the first electrode.

Accordingly, a portion to form the slope is preferably made from a metal that reflects light, for example, a material mainly containing aluminum or silver, whereas the center portion that is in contact with the organic compound-containing layer is formed from an anode material having a large work function or a cathode material having a small work function.

Structure 1 of the present invention disclosed herein is a light emitting device comprising:

a first electrode connected to a thin film transistor on a substrate that has an insulating surface;

an insulator covering the edge of the first electrode;

a layer which contains an organic compound and which is in contact with the top face of the first electrode; and a second electrode that is in contact with the top face of the layer, characterized in that the first electrode is sloped from its edge toward its center to have a slope and that the slope reflects light emitted from the organic compound-containing layer.

Structure 2 of the present invention is a light emitting device comprising:

a first electrode connected to a thin film transistor on a substrate that has an insulating surface;

an insulator covering the edge of the first electrode;

a layer which contains an organic compound and which is in contact with the top face of the first electrode; and a second electrode that is in contact with the top face of the layer, characterized in that the first electrode is thinner in the center than in the edge to form a concave shape.

Structure 3 of the present invention is a light emitting device comprising:

a first electrode connected to a thin film transistor on a substrate that has an insulating surface;

an insulator covering the edge of the first electrode;

a layer which contains an organic compound and which is in contact with the top face of the first electrode; and a second electrode that is in contact with the top face of the layer, characterized in that the first electrode has a multi-layer structure and that the number of layers is larger in the edge than in the center.

The present invention gives an insulator placed between pixels (called as a bank, a partition wall, a barrier or the like) a particular shape to avoid insufficient coverage when forming by application a high molecular weight organic compound film. The above structures are characterized in that an upper edge portion of the insulator is curved to have a radius of curvature and that the radius of curvature is set to 0.2 to 3 µm. The taper angle of the insulator is set to 35 to 55°.

By giving the edge the radius of curvature, the level difference is well covered and the organic compound-containing layer and other films formed on the insulator can be made very thin.

The above structures are characterized in that the first electrode is sloped toward its center and that the angle of inclination (also called as a taper angle) of the slope is more than 30° and less than 70°, preferably, less than 60°. The angle of inclination, the material and thickness of the organic compound layer, and the material and thickness of the second electrode have to be set suitably to prevent light reflected by the slope of the first electrode from scattering or straying between layers.

The above structures are characterized in that the second electrode is a conductive film transmissive of light, for example, a thin metal film or a transparent conductive film.

The above structures are characterized in that the first electrode has a concave shape and is formed in a self-aligning manner using the insulator as a mask. Accordingly, there is no need for a new mask to form the first electrode shape. The stepped portion (the upper edge portion of the slope portion) of the first electrode is almost flush with a side face of the insulator and, in order to cover the level difference well, it is preferable for the slope of the first electrode and the side face of the insulator to have the same angle of inclination.

The above structures are characterized in that the first electrode is an anode whereas the second electrode is a cathode. Alternatively, the above structures are characterized in that the first electrode is a cathode whereas the second electrode is an anode.

The light emitting device in each of the above structures is characterized in that the organic compound-containing layer is formed from a material that emits white light and that the layer is used in combination with color filters provided in a sealing member. Alternatively, the light emitting device in each of the above structures is characterized in that the organic compound-containing layer is formed from a material that emits light of a single color and that the layer is used in combination with color conversion layers or colored layers provided in a sealing member.

In the present invention, after the level difference in the first electrode is formed, a wire (also called as an auxiliary wire or a third electrode) may be formed by evaporation using an evaporation mask on the insulator placed between pixel electrodes in order to reduce the film resistance of the electrode that serves as a cathode (the electrode that transmits light). The present invention is also characterized in that the auxiliary wire is used to form a lead-out wire to obtain connection with other wires in layers below.

A structure of the present invention for obtaining Structures 1, 2, and 3 is a method of manufacturing a light emitting device with a light emitting element having an anode, a layer containing an organic compound, and a cathode, the organic compound-containing layer being in contact with the anode, the cathode being in contact with the organic compound-containing layer, characterized by comprising:

a step of forming an insulator to cover the edge of a first electrode that is a laminate of metal layers;

a step of thinning the center of the first electrode so as to expose a slope along the edge of the first electrode by etching using the insulator as a mask;

a step of forming the organic compound-containing film; and a step of forming a second electrode on the organic compound-containing film from a thin metal film that transmits light.

The above structure related to a manufacturing method is characterized in that the first electrode is a laminate of a metal layer reflecting light and a metal layer serving as an etching stopper and that the metal layer reflecting light is etched to expose a metal material that reflects light in the slope.

As a result of the etching of the first electrode, a surface of the metal layer serving as an etching stopper may be etched slightly.

The above structure related to a manufacturing method is characterized in that the first electrode is an anode and is formed from a metal layer that is larger in work function than the second electrode.

The above structure related to a manufacturing method is characterized in that the first electrode is a laminate of a first metal layer containing titanium, a second metal layer containing titanium nitride or tungsten nitride, a third metal layer containing aluminum, and a fourth metal layer containing titanium nitride.

For the first metal layer, a metal material having satisfactory ohmic contact with silicon (typically titanium) is suitable because the first metal layer is in contact with a source region or drain region of a TFT. A material having a large work function is preferred for the second metal layer which functions as an anode. For the third metal layer which reflects light of a light emitting element, a metal material having high light reflectance is preferred. A metal material which can prevent hillock and whisker of the third metal layer and which can avoid specular reflection of the third metal layer (titanium nitride or titanium) is preferred for the fourth metal layer.

The first electrode is not limited to the above four-layer structure but may have any laminate structure as long as it includes two layers or more, that is, at least a metal layer to function as an anode and a metal layer that has a slope for reflecting light of a light emitting element.

FIG. 12 shows the reflectance of an aluminum film containing a minute amount of Ti and the reflectance of a TiN film (100 nm). Titanium nitride is a material that can prevent specular reflection. When titanium nitride is used for an anode, almost no light is reflected and therefore interference by return light of a light emitting element does not take place. Accordingly, the device can have a panel structure that does not need a circular polarizing plate.

For example, the first electrode may have a six-layer structure with the first metal layer being a titanium film, the second metal layer being a titanium nitride film, the third metal layer being an aluminum-containing metal film, the fourth metal layer being a titanium nitride film, the fifth metal layer being an aluminum-containing metal film, and the sixth metal layer being a titanium nitride film. In this sixth-layer structure, the fourth metal layer serves as an anode and the fifth metal layer reflects light from a light emitting element at its slope. Since the aluminum-containing metal film is provided under the anode, the resistance of the entire first electrode can be lowered. This six-layer structure is particularly effective for a light emitting display device in which the area per pixel (light emitting region) is large or which has a large screen.

In the above structure related to a manufacturing method, the work function of the metal layer that serves as an anode may be raised by ultraviolet ray irradiation treatment in an ozone atmosphere (called as UV-ozone treatment). FIG. 13 shows results of measuring changes in work function with UV-ozone treatment time. As shown in FIG. 13, the initial work function of titanium nitride, 4.7 eV, is raised by UV treatment (for six minutes) to 5.05 eV. Note that, similarly, the work function of tantalum nitride shows an increase. In the above structure related to a manufacturing method, the work function of the metal layer that serves as an anode may be raised by plasma treatment using one or more kinds of gas selected from the group consisting of $N_2$, $O_2$, Ar, $BCl$, and $Cl_2$.

In FIG. 13, the work function is measured in an atmospheric air by photoelectron spectroscopy using "Photoelectron Spectroscope AC-2", a product of RIKEN KEIKI Co., Ltd.

If plasma etching is employed in the step of thinning the center of the first electrode so as to expose a slope along the edge of the first electrode by etching using the insulator as a mask, some etching gas is capable of increasing the work function of the metal layer that serves as an anode at the same time the center is thinned.

The above structure related to a manufacturing method is characterized in that an upper edge portion of the insulator for covering the edge portion of the first electrode is curved to have a radius of curvature and that the radius of curvature is set to 0.2 to 3 μm.

An EL element has a layer containing an organic compound that provides luminescence upon application of electric field (electro luminescence) (hereinafter referred to as EL layer), in addition to an anode and a cathode. Luminescence obtained from organic compounds is divided into light emission upon return to the base state from singlet excitation (fluorescence) and light emission upon return to the base state from triplet excitation (phosphorescence). Both types of light emission can be employed in a light emitting device manufactured in accordance with the present invention.

A light emitting element having an EL layer (EL element) is structured so as to sandwich the EL layer between a pair of electrodes. Usually, the EL layer has a laminate structure. A typical example of the laminate structure is one consisting of a hole transporting layer, a light emitting layer, and an electron transporting layer. This structure has very high light emission efficiency and is employed in most of light emitting devices that are currently under development.

Other examples of the laminate structure include one in which a hole injection layer, a hole transporting layer, a light emitting layer, and an electron transporting layer are layered on an anode in this order, and one in which a hole injection layer, a hole transporting layer, a light emitting layer, an electron transporting layer, and an electron injection layer are layered on an anode in this order. The light emitting layer may be doped with a fluorescent pigment or the like. These layers may all be formed of low molecular weight materials or may all be formed of high molecular weight materials. In this specification, all layers placed between an anode and a cathode together make an EL layer. Accordingly, the above hole injection layer, hole transporting layer, light emitting layer, electron transporting layer, and electron injection layer are included in an EL layer.

In a light emitting device of the present invention, how screen display is driven is not particularly limited. For example, a dot-sequential driving method, a linear-sequential driving method, a plane-sequential driving method or the like can be employed. Typically, a linear-sequential driving method is employed and a time ratio, gray scale driving method or an area ratio gray scale driving method is chosen suitably. A video signal inputted to a source line of the light emitting device may be an analog signal or a digital signal, and driving circuits and other circuits are designed in accordance with the type of the video signal as appropriate.

BRIEF DESCRIPTION OF THE DRAWINGS

In the accompanying drawings:
FIGS. 5A to 5C are diagrams showing Embodiment Mode 2;
FIGS. 9A and 9B are diagrams showing Embodiment 3.

FIG. 12 is a graph showing the reflectance of an aluminum film that contains a minute amount of Ti and the reflectance of a TiN film (100 nm)

DETAILED DESCRIPTION OF THE PREFERRED EMBODIMENTS

Embodiment Modes of the present invention will be described below.

Embodiment Mode 1

Figure 1A:
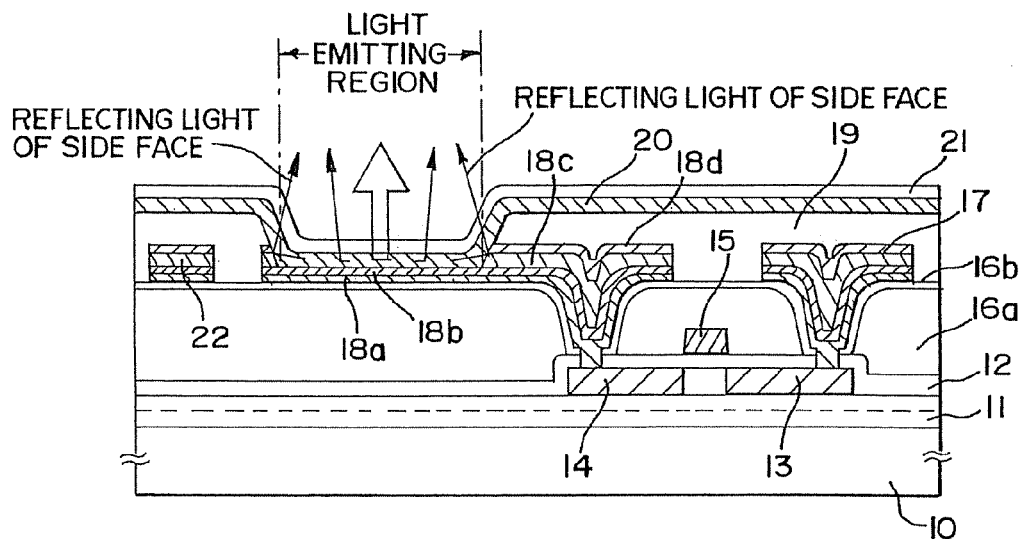
FIGS. 1A and 1B are diagrams showing Embodiment Mode 1.

FIG. 1A is a sectional view of an active matrix light emitting device (a part of one pixel). Described here as an example is a light emitting element which uses as its light emitting layer an organic compound-containing layer formed of a high molecular weight material that emits white light.

In FIG. 1A, a TFT (p-channel TFT) on a substrate 10 having an insulating surface is an element for controlling a current flowing into an EL layer 20 that emits white light. Of regions denoted by 13 and 14, one is a source region and the other is a drain region. A base insulating film 11 (here a laminate of an insulating nitride film as a lower layer and an insulating oxide film as an upper layer) is formed on the substrate 10. A gate insulating film 12 is placed between a gate electrode 15 and an active layer of the TFT. Denoted by 16a is an interlayer insulating film formed of an organic material or an inorganic material. Reference symbol 16b represents a protective film formed of silicon nitride, silicon nitroxide, aluminum nitride, or aluminum nitroxide. Although not shown in the drawing, one pixel has another or more TFTs (n-channel TFTs or p-channel TFTs) other than this TFT. The TFT here has one channel formation region. However, the number of channel formation regions is not particularly limited, and the TFT may have more than one channels.

Reference symbols 18a to 18d denote layers of a first electrode, namely, an anode (or cathode) of the organic light emitting element whereas a second electrode formed from a conductive film, namely, a cathode (or anode) of the organic light emitting element is denoted by 21. Here, reference symbol 18a is a titanium film, 18b is a titanium nitride film, 18c is a film mainly containing aluminum, and 18d is a titanium nitride film. The films are layered in order and 18b that is in contact with the organic compound-containing layer 20 functions as the anode. A power supplying line 17 is formed to have the same laminate structure. Since the above laminate structure includes a film mainly containing aluminum, a low-resistant wire is obtained and a source wire 22 and others are formed at the same time.

To make the organic compound-containing layer 20 emit white light, an aqueous solution of poly(ethylene dioxythiophene)/poly(styrene sulfonic acid) (PEDOT/PSS) is applied to the entire surface and baked to form a film that works as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is applied to the entire surface and baked to form a film that works as a light emitting layer. The solvent of PEDOT/PSS is water and PEDOT/PSS is not dissolved in an organic solvent. Accordingly, the hole injection layer does not go back to the melted state when PVK is applied thereon. Since PEDOT/PSS and PVK have different solvents, they are preferably formed into films in different film forming chambers. The organic compound-containing layer 20 may instead be a single layer. In this case, a 1,3,4-oxadiazole derivative (PBD) capable of transporting electrons is dispersed in polyvinyl carbazole (PVK) capable of transporting holes. Another method to obtain white light emission is to disperse 30 wt % of PBD as an electron transporting agent and disperse four kinds of pigments (TPB, coumarin 6, DCM1, and Nile red) in appropriate amounts.

Alternatively, a combination of films is chosen appropriately from a film containing an organic compound that emits red light, a film containing an organic compound that emits green light, and a film containing an organic compound that emits blue light to overlap each other and mix their colors, thereby obtaining white light emission.

For the second electrode 21, a $CaF_2$ film is formed by evaporation to have a thickness of 1 to 10 nm and then an Al film is formed by sputtering or evaporation to have a thickness of about 10 nm to function as the cathode. The material and thickness of the cathode have to be chosen suitably to transmit light from the organic compound-containing layer 20. In this specification, the term cathode includes not only a single layer of a material having a small work function but also a laminate of a thin film of a small work function material and a conductive film.

Using an Al film as the second electrode 21 means that a material that is not an oxide comes into contact with the organic compound-containing layer 20. As a result, the reliability of the light emitting device is improved. Instead of an Al film, a transparent conductive film (such as an ITO (indium oxide-tin oxide alloy) film, an $In_2O_3$—ZnO (indium oxide-zing oxide alloy) film, or a ZnO (zinc oxide) film) may be employed as the second electrode 21. The $CaF_2$ layer may be replaced by a thin metal layer (typically a film of such alloy as MgAg, MgIn, or AlLi).

Both end portions of the first electrode 18 and in-between areas are covered with an insulator 19 (also called as a barrier or a bank). In the present invention, what sectional shape the insulator 19 takes is important. The insulator 19 is formed by etching treatment, through which the concave shape of the first electrode 18 is obtained. If an upper edge portion of the insulator 19 is not curved, a film formation defect is likely to occur and an unwanted convex portion is formed on the upper edge of the insulator 19. Therefore, the present invention uses etching treatment to make an upper edge portion of the insulator 19 curved to have a radius of curvature, to form a slope along the curved face partially exposing the layers 18c and 18d of the first electrode, and to expose the layer 18b of the first electrode in a region that serves as a light emitting region. The exposed surface of the layer 18b of the first electrode may be leveled by CMP or other treatment. The radius of curvature is preferably set to 0.2 to 3 µm. The present invention can give the organic compound film and the metal film excellent coverage. The taper angle in the side face of the insulator 19 is equal to the taper angle in the slope of the layers 18c and 18d of the first electrode, and is set to 45°±10°.

For instance, when the insulator 19 is formed of positive acrylic resin, the layer 18a of the first electrode is a 60 nm thick Ti film, the layer 18b of the first electrode is a 100 nm thick TiN film, the layer 18c of the first electrode is a 350 nm thick Al—Ti film, and the layer 18d of the first electrode is a 100 nm thick Ti film, etching conditions include employing ICP etching apparatus, using as reaction gas $BCl_3$ and $Cl_2$ at a ratio of 60 (sccm):20 (sccm), and giving an RF (13.56 MHz) power of 450 W to a coiled electrode at a pressure of 1.9 Pa. At the same time, the substrate side (sample stage) is also given an RF (13.56 MHz) power of 100 W for dry etching. After the Al—Ti layer (the layer 18c of the first electrode) is etched, the TiN layer (the layer 18b of the first electrode) is exposed by over-etching for 15 seconds.

The present invention is characterized in that light emitted from the organic compound layer 20 is reflected at the slope of the layers 18c and 18d of the first electrode to increase the total amount of light taken out in the direction indicated by the arrow in FIG. 1A.

Figure 1B:
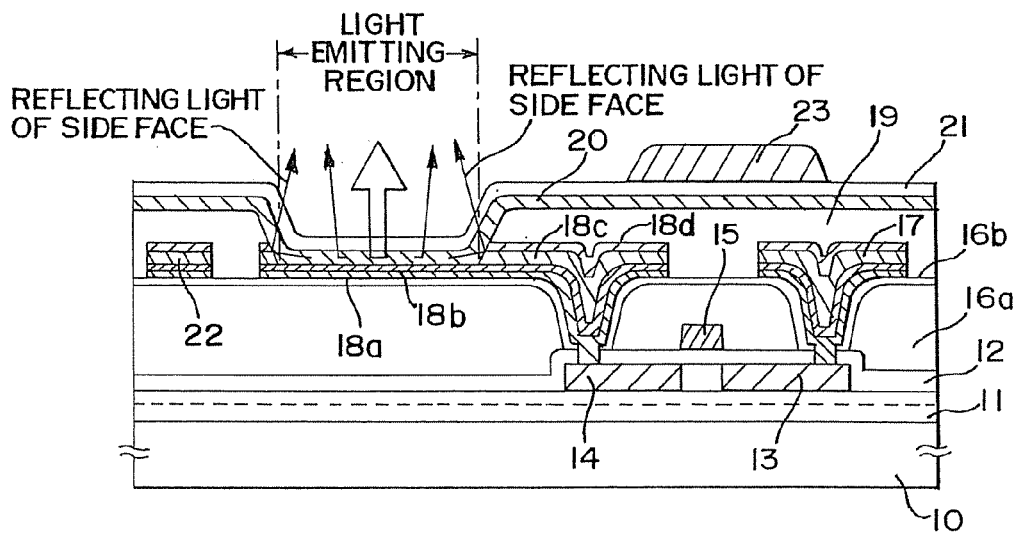

As shown in FIG. 1B, an auxiliary electrode 23 may be provided on the conductive film 21 in order to lower the resistance of the conductive film (cathode) 21. The auxiliary electrode 23 is selectively formed by evaporation using an evaporation mask.

Although not shown in the drawing, a protective film is preferably formed on the second electrode 21 in order to enhance the reliability of the light emitting device. This protective film is an insulating film which mainly contains silicon nitride or silicon nitroxide and which is formed by sputtering (the DC method or the RF method), or a thin film mainly containing carbon. A silicon nitride film can be formed in an atmosphere containing nitrogen and argon using a silicon target. A silicon nitride target may be employed instead. The protective film may also be formed by film forming apparatus that uses remote plasma. The protective film is made as thin as possible to allow emitted light to pass through the protective film.

The present invention is characterized in that the thin film mainly containing carbon is a DLC (diamond-like carbon) film with a thickness of 3 to 50 nm. In viewpoint of short-range order, a DLC film has $SP^3$ bonds as bonds between carbons. Macroscopically, a DLC film has an amorphous structure. 70 to 95 atomic % carbon and 5 to 30 atomic % hydrogen constitute a DLC film, giving the film high degree of hardness and excellent insulating ability. Such DLC film is characteristically low in transmittance of gas such as steam and oxygen. Also, it is known that the hardness of a DLC film is 15 to 25 GPa according to measurement by a microhardness tester.

A DLC film is formed by plasma CVD (typically, RF plasma CVD, microwave CVD, or electron cyclotron resonance (ECR) CVD) or sputtering. Any of the film formation methods can provide a DLC film with excellent adhesion. In forming a DLC film, the substrate is set as a cathode. Alternatively, a dense and hard DLC film is formed by applying negative bias and utilizing ion bombardment to a certain degree.

Reaction gas used to form the film are hydrogen gas and hydro carbon-based gas (for example, $CH_4$, $C_2H_2$, or $C_6H_6$) and are ionized by glow discharge. The ions are accelerated to collide against the cathode to which negative self-bias is applied. In this way, a dense, flat, and smooth DLC film is obtained. The DLC film is an insulating film transparent or translucent to visible light.

In this specification, being transparent 10 visible light means having a visible light transmittance of 80 to 100% whereas being translucent to visible light means having a visible light transmittance of 50 to 80%.

The description given here takes a top gate TFT as an example. However, the present invention is applicable to any TFT structure. For instance, the invention can be applied to a bottom gate (reverse stagger) TFT and a forward stagger TFT.

Embodiment Mode 2

A method of combining a white color luminescent element and a color filter (hereinafter, referred to as color filter method) will be explained in reference to FIG. 5A as follows.

The color filter method is a system of forming a light emitting element having an organic compound film displaying white color luminescence and passing the provided white color luminescence through a color filter to thereby achieve luminescence of red, green, and blue.

Although there are various methods of achieving white color luminescence, a case of using a luminescent layer comprising a high molecular material formable by coating will be explained here. In this case, doping of a color pigment to the high molecular material for constituting a luminescent layer can be carried out by preparing a solution and can extremely easily be achieved in comparison with a vapor deposition method for carrying out common vapor deposition for doping a plurality of color pigments.

Specifically, after coating and baking an aqueous solution of poly(ethylenedioxythiophene)/poly(stylenesulfonic acid) (PEDOT/PSS) operated as a hole injecting layer over an entire face of an anode comprising a metal having large work function (Pt, Cr, W, Ni, Zn, Sn, In), thereafter coating and baking a polyvinyl carbazole (PVK) solution doped with a luminescent core pigment (1,1,4,4-tetraphenyl 1,3-butadience (TPB), 4-dicyanomethylene-2-methyl-6-(p-dimethylaminostyryl)-4H-pyran (DCM1), Nile red, coumarin 6 or the like) operating as the luminescent layer over the entire face, a cathode comprising a laminated layer of a thin film including metal having small work function (Li, Mg, Cs) and a transparent conductive film (ITO (indium oxide tin oxide alloy), indium oxide zinc oxide alloy ($In_2O_3$—ZnO), zinc oxide (ZnO) or the like) laminated thereabove is formed. Further, PEDOT/PSS uses water as a solvent and is not dissolved in an organic solvent. Therefore, even when PVK is coated thereabove, there is no concern of dissolving again. Further, kinds of solvents of PEDOT/PSS and PVK differ from each other and therefore, it is preferable that the same film forming chamber is not used therefor.

Further, although an example of laminating organic compound layers is shown in the above-described example, a single layer of an organic compound layer can be constituted. For example, 1,3,4-oxadiazole derivative (PBD) having electron transporting performance may be dispersed in polyvinyl carbazole (PVK) having hole transporting performance. Further, white color luminescence is achieved by dispersing 30 wt % of PBD as an electron transporting agent and dispersing pertinent amounts of four kinds of color pigments (TPB, coumarin 6, DCM1, Nile red).

Further, the organic compound film is formed between the anode and the cathode and by recombining holes injected from the anode and electrons injected from the cathode at the organic compound film, white color luminescence is achieved in the organic compound film.

Further, it is also possible to achieve white color luminescence as a whole by pertinently selecting an organic compound film for carrying out red color luminescence, an organic compound film for carrying out green color luminescence, and an organic compound film for carrying out blue color luminescence, and laminating the films to mix color.

The organic compound film formed as described above can achieve white color luminescence as a whole.

By forming color filters respectively provided with the coloring layer (R) for absorbing other than red color luminescence, a coloring layer (G) for absorbing other than green color luminescence and the coloring layer (B) for absorbing other than blue color luminescence in a direction of carrying out white color luminescence by the organic compound film, white color luminescence from the light emitting element can respectively be separated to achieve red color luminescence, green color luminescence and blue color luminescence. Further, in the case of an active matrix type, a structure in which TFT is formed between the substrate and the color filter is constituted.

Further, starting from simplest stripe pattern, skewed mosaic alignment, triangular mosaic alignment, RGBG four pixels alignment or RGBW four pixels alignment can be used for the coloring layer (R, G, B).

A coloring layer for constituting a color filter is formed by using a color resist comprising an organic photosensitive material dispersed with a pigment. Further, chromaticity coordinates of white color luminescence are (x, y)=(0.34, 0.35). It is known that color reproducing performance as full color is sufficiently ensured.

Further, in this case, even when achieved luminescent color differs, the constitution is formed with all the organic compound films displaying white color luminescence and therefore, it is not necessary to form the organic compound film to coat to divide for each luminescent color. Further, a polarizer for a circularly polarized light for preventing mirror reflection is not particularly needed.

Next, a CCM (color changing mediums) method realized by combining a blue color light emitting element having a blue color luminescent organic compound film and a fluorescent color changing layer will be explained in reference to FIG. 5B.

According to the CCM method, the fluorescent color changing layer is excited by blue color luminescence emitted from the blue color luminescent element and color is changed by each color changing layer. Specifically, changing from blue color to red color by the color changing layer (B→R), changing from blue color to green color by the color changing layer (B→G) and changing from blue color to blue color by the color changing layer (B→B) (further, changing from blue color to blue color may not be carried out) are carried out to achieve red color, green color and blue color luminescence. Also in the case of the CCM method, the structure in which TFT is formed between the substrate and the color changing layer is constituted in the case of the active matrix type.

Further, also in this case, it is not necessary to form the organic compound films to coat to divide also in this case. Further, a polarizer for a circularly polarized light for preventing mirror reflection is not particularly needed.

Further, when the CCM method is used, since the color changing layer is florescent, the color changing layer is excited by external light and a problem of reducing contrast is posed and therefore, as shown by FIG. 5C, the contrast may be made conspicuous by mounting color filters.

Further, this embodiment mode can be combined with Embodiment Mode 1.

Embodiment Mode 3

Figure 4A:
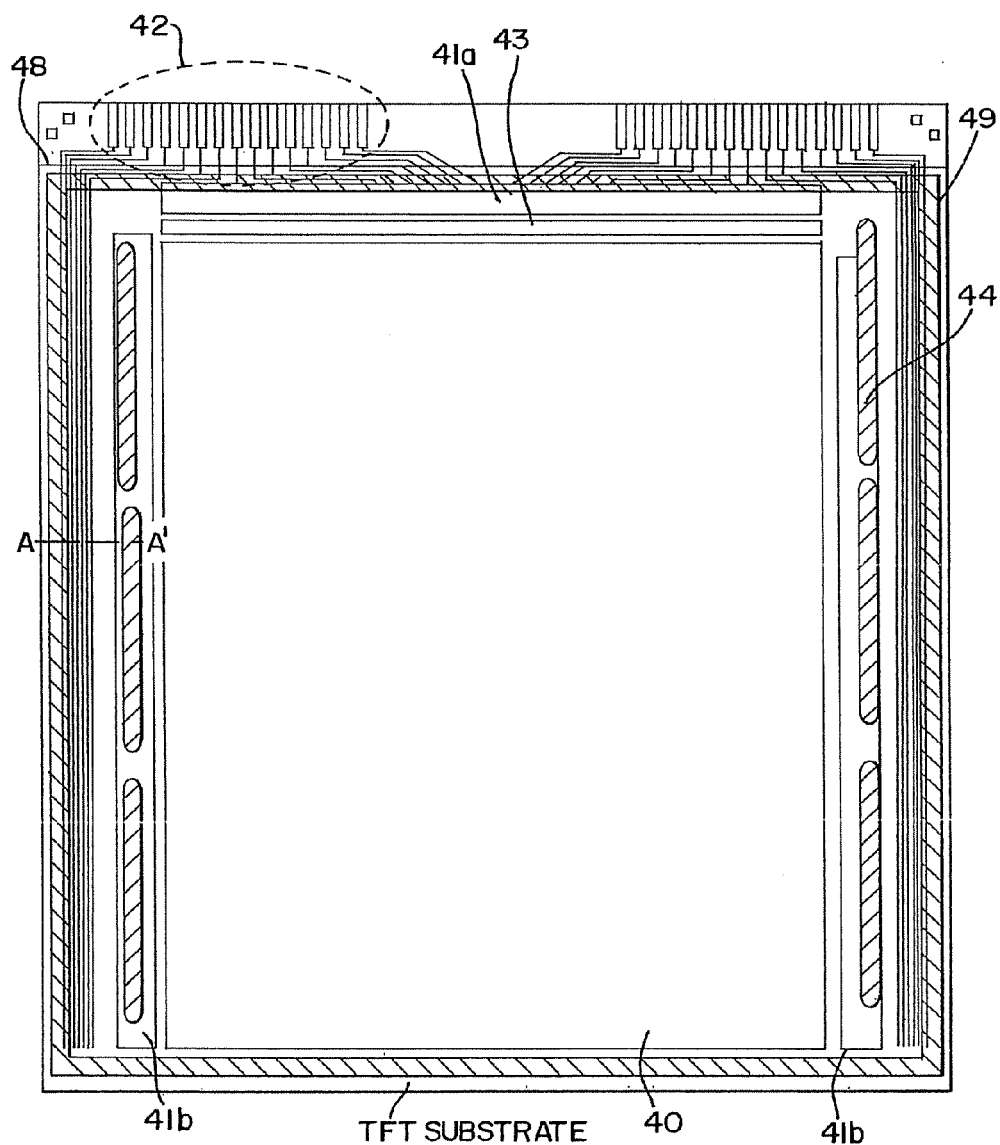
FIGS. 4A to 4C are diagrams showing Embodiment Mode 3.
Figure 4B:
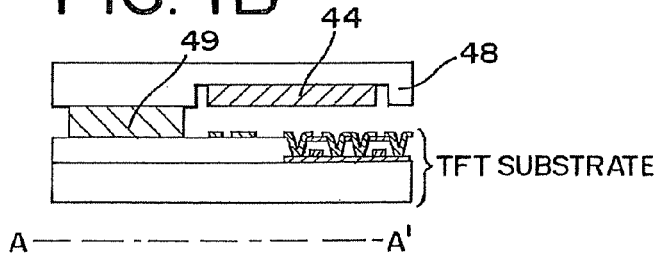

Here, a total of an EL module and arrangement of a drying agent will be explained in reference to FIG. 4. FIG. 4A is a top view of the EL module. FIG. 4B is a part of a cross-sectional view.

Figure 4C:
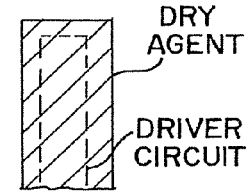

A substrate provided with numerous TFTs (also referred to as TFT substrate) is provided with a pixel portion 40 for display, driver circuits 41a and 41b for driving respective pixels of the pixel portion, a connecting portion for connecting the electrode provided over the EL layer and an extended wiring, a terminal portion 42 for pasting FPC for connecting to outside circuit and a drying agent 44. Further, the drying agent may be arranged such that a total of the driver circuits is concealed by the drying agent as shown by FIG. 4C although the drying agent is arranged to overlap a portion thereof in FIG. 4A and FIG. 4B. Further, the constitution is hermetically sealed by the substrate for sealing the EL element and a seal member 49. Further, FIG. 4B is a sectional view when the constitution is cut by a chain line B-B' in FIG. 4A.

Pixels are numerously arranged regularly at the pixel portion 40 and arranged in an order of R, G, B in X direction although not illustrated here.

Further, as shown by FIG. 4B, the seal substrate 48 is pasted by the seal member 49 to maintain an interval of about 2 through 30 μm and all of the light emitting elements are hermetically sealed. A recessed portion is formed at the seal substrate 48 by sand blast method or the like and the recessed portion is arranged with the drying agent. Further, the seal member 49 is preferably constituted by a narrow frame formation to overlap a portion of the driver circuits. Degassing is preferably carried out by carrying out annealing in vacuum immediately before pasting the seal substrate 48 by the seal member 49. Further, when the seal substrate 48 is pasted, the pasting is preferably carried out under an atmosphere including an inert gas (rare gas or nitrogen).

Further, this embodiment mode can freely be combined with Embodiment Mode 1 or Embodiment Mode 2.

The present invention is described in more detail with the following Embodiments.

Embodiment 1

In this embodiment, a brief description is given with reference to FIGS. 2A to 3C on an example of procedure of forming a light emitting element in accordance with the present invention.

First, a base insulating film 31 is formed on a substrate 30 which has an insulating surface.

The base insulating film 31 is a laminate and the first layer is a silicon oxynitride film formed to have a thickness of 10 to 200 nm (preferably 50 to 100 nm) by plasma CVD using as reaction gas $SiH_4$, $NH_3$, and $N_2O$. Here, a silicon oxynitride film (composition ratio: Si=32%, O=27%, N=24%, H=17%) with a thickness of 50 nm is formed. The second layer of the base insulating film is a silicon oxynitride film formed to have a thickness of 50 to 200 nm (preferably 100 to 150 nm) by plasma CVD using as reaction gas $SiH_4$ and $N_2O$. Here, a silicon oxynitride film (composition ratio: Si=32%, O=59%, N=7%, H=2%) with a thickness of 100 nm is formed. Although the base insulating film 31 in this embodiment has a two-layer structure, a single layer or a laminate of more than two layers of the above insulating films may be employed instead.

Next, a semiconductor layer is formed on the base film. The semiconductor layer to serve as an active layer of the TFT is obtained by forming a semiconductor film that has an amorphous structure through a known method (sputtering, LPCVD, plasma CVD, or the like), subjecting the film to known crystallization treatment (laser crystallization, thermal crystallization, thermal crystallization using nickel or other catalysts, or the like), and then patterning the obtained crystalline semiconductor film into a desired shape. The thickness of the semiconductor layer is set to 25 to 80 nm (preferably 30 to 60 nm). The material of the crystalline semiconductor film is not limited but preferably is silicon, a silicon germanium alloy, or the like.

When laser crystallization is employed to form the crystalline semiconductor film, a pulse oscillation type or continuous wave excimer layer, YAG layer, or $YVO_4$ laser is used. Laser light emitted from one of such laser oscillators is collected by an optical system into a linear shape before irradiating the semiconductor film. Crystallization conditions are chosen to suit individual cases. However, when an excimer layer is employed, the pulse oscillation frequency is set to 30 Hz and the laser energy density is set to 100 to 400 mJ/cm$^2$ (typically 200 to 300 mJ/cm$^2$). When a YAG laser is employed, the second harmonic thereof is used, the pulse oscillation frequency is set to 1 to 10 kHz, and the laser energy density is set to 300 to 600 mJ/cm$^2$ (typically 350 to 500 mJ/cm$^2$). The laser light is collected to have a width of 100 to 1000 μm, for example, 400 mm, into a linear shape and the entire surface of the substrate is irradiated with this linear laser light setting the laser light overlap ratio to 80 to 98%.

Next, the surface of the semiconductor layer is washed with an etchant containing hydrofluoric acid to form a gate insulating film 33 that covers the semiconductor layer. The gate insulating film 33 is an insulating film containing silicon and is formed by plasma CVD or sputtering to have a thickness of 40 to 150 nm. In this embodiment, a silicon oxynitride film (composition ratio: Si=32%, O=59%, N=7%, H=2%) is formed by plasma CVD to have a thickness of 115 nm. The gate insulating film is not limited to the silicon oxynitride film, of course, but may be a single layer or laminate of other insulating films that contain silicon.

The surface of the gate insulating film 33 is washed and then a gate electrode is formed.

Next, the semiconductor layer is appropriately doped with an impurity element that imparts a semiconductor the p type conductivity, here, boron (B), to form a source region 32 and a drain region 32. After the doping, the semiconductor layer is subjected to heat treatment, irradiation of intense light, or laser light irradiation in order to activate the impurity element. At the same time the impurity element is activated, plasma damage to the gate insulating film and plasma damage to the interface between the gate insulating film and the semiconductor layer are repaired. It is particularly effective to activate the impurity element by irradiating the substrate from the front or back with the second harmonic of a YAG laser at room temperature to 300° C. A YAG laser is a preferable activation measure because it requires little maintenance.

The subsequent steps include forming an interlayer insulating film 35 from an organic or inorganic material (an applied silicon oxide film, PSG (phosphorus-doped glass), BPSG (glass doped with boron and phosphorus), or the like), hydrogenating the semiconductor layer, and forming contact holes reaching the source region or drain region. Then, a source electrode (wire) and a first electrode (drain electrode) 36 are formed to complete the TFT (p-channel TFT).

Although the description in this embodiment uses a p-channel TFT, an n-channel TFT can be formed if an n type impurity element (such as P or As) is used instead of a p type impurity element.

The description given in this embodiment takes a top gate TFT as an example. However, the present invention is applicable to any TFT structure. For instance, the invention can be applied to a bottom gate (reverse stagger) TFT and a forward stagger TFT.

Figure 3A:
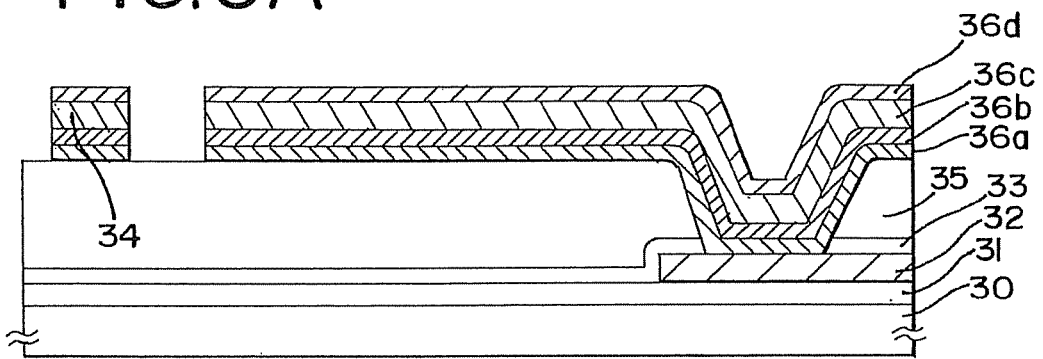
FIGS. 3A to 3C are diagrams showing Embodiment 1.

Formed through the above steps are the TFT (only the drain region 32 is shown in the drawing), the gate insulating film 33, the interlayer insulating film 35, and layers 36a to 36d of the first electrode (FIG. 3A).

The layers 36a to 36d of the first electrode in this embodiment are each a film mainly containing an element selected from the group consisting of Ti, TiN, TiSi$_x$N$_y$, Al, Ag, Ni, W, WSi$_x$, WN$_x$, WSi$_x$N$_y$, Ta, TaN$_x$, TaSi$_x$N$_y$, NbN, MoN, Cr, Pt, Zn, Sn, In, and Mo, or a film mainly containing an alloy or compound material of the above elements, or a laminate of these films. The total thickness of the layers 36a to 36d is set between 100 nm and 800 nm.

Particularly, the layer 36a of the first electrode that comes into contact with the drain region 32 is preferably formed of a material that can form an ohmic contact with silicon, typically titanium, and is given a thickness of 10 to 100 nm. For the layer 36b of the first electrode, a material that has a large work function when formed into a thin film (TiN, TaN, MoN, Pt, Cr, W, Ni, Zn, Sn) is preferred, and the thickness of the layer is set to 10 to 100 nm. For the layer 36c of the first electrode, a metal material reflective of light, typically, a metal material mainly containing Al or Ag, is preferred, and the thickness of the layer is set to 100 to 600 nm. The layer 36b of the first electrode also functions as a blocking layer for preventing the layers 36c and 36a of the first electrode from forming an alloy. For the layer 36d of the first electrode, a material capable of preventing oxidation and corrosion of the layer 36c of the first electrode and avoiding hillock or the like is preferred (typically a metal nitride such as TiN or WN), and the thickness of the layer is set to 20 to 100 nm.

The layers 36a to 36d of the first electrode can be formed at the same time other wires, for example, a source wire 34 and a power supplying line, are formed. Accordingly, the process needs fewer photomasks (seven masks in total: a patterning mask for the semiconductor layer (Mask 1), a patterning mask for the gate wire (Mask 2), a doping mask for selective doping by an n type impurity element (Mask 3), a doping mask for selective doping by a p type impurity element (Mask 4), a mask for forming contact holes that reach the semiconductor layer (Mask 5), a patterning mask for the first electrode, the source wire, and the power supplying line (Mask 6), and a mask for forming an insulator (Mask 7)). In prior art, the first electrode is formed on a layer different from the one where the source wire and the power supplying line are formed and therefore a mask for forming the first electrode alone is needed, thus making the number of masks required 8 in total. When the layers 36a to 36d of the first electrode and the wires are formed at the same time, it is desirable to set the total wire electric resistance low.

Figure 3B:
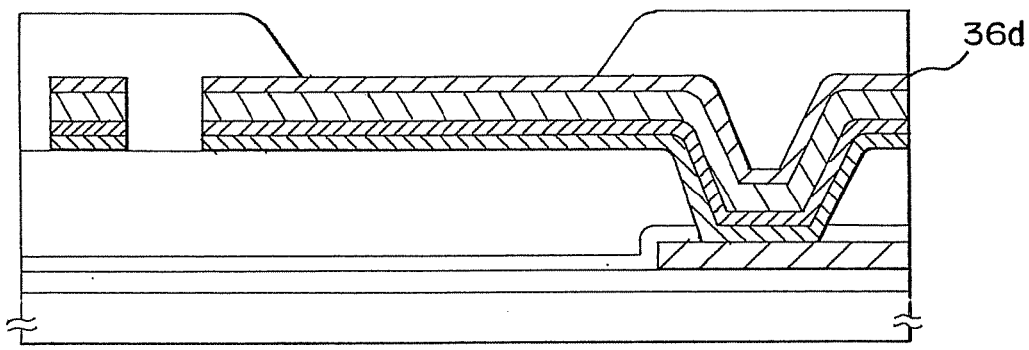

Next, the insulator (called as a bank, a partition wall, a barrier, or the like) is formed to cover the edge of the first electrode (and a portion that is in contact with the drain region 32) (FIG. 3B). The insulator is a film or a laminate of inorganic materials (such as silicon oxide, silicon nitride, and silicon oxynitride) and photosensitive or non-photosensitive organic materials (such as polyimide, acrylic, polyamide, polyimideamide, resist, and benzocyclobutene). Photosensitive organic resin is used in this embodiment. If positive photosensitive acrylic is used as a material of the insulator, for example, it is preferable to curve only an upper edge portion of the insulator to give a radius of curvature. A negative photosensitive material which becomes insoluble in an etchant under light and a positive photosensitive material which becomes soluble in an etchant under light both can be used for the insulator.

Figure 3C:
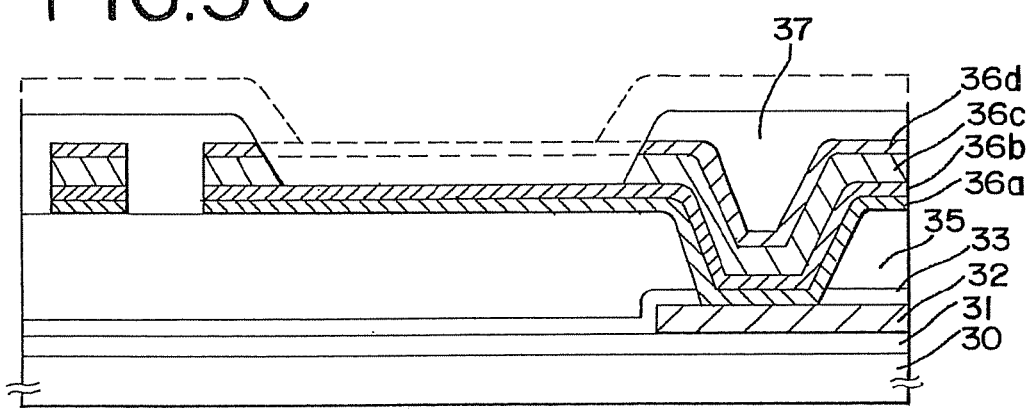

The insulator is etched as shown in FIG. 3C and, simultaneously, the layers 36c and 36d of the first electrode are partially removed. It is important to etch the films such that a slope is formed in the exposed face of the layer 36c of the first electrode and the layer 36b of the first electrode obtains a flat exposed face. This etching uses dry etching or wet etching, and is finished in one step or divided into several steps. Etching conditions that make the selective ratio between the layer 36b of the first electrode and the layer 36c of the first electrode high are chosen. Preferably, the final radius of curvature of the upper edge portion of the insulator is 0.2 to 3 μm. The final angle of the slope descending toward the center of the first electrode (the angle of inclination or taper angle) is more than 30° and less than 70°, so that the slope reflects light emitted from an organic compound-containing layer which is formed later.

Next, an organic compound-containing layer 38 is formed by evaporation or application. When evaporation is chosen, for example, a film forming chamber is vacuum-exhausted until the degree of vacuum reaches $5×10^{-3}$ Torr (0.665 Pa) or less, preferably $10^{-4}$ to $10^{-6}$ Pa, for evaporation. Prior to evaporation, the organic compound is vaporized by resistance heating. The vaporized organic compound flies out to the substrate as the shutter is opened for evaporation. The vaporized organic compound flies upward and then deposits on the substrate through an opening formed in a metal mask. Layers of the organic compound-containing layer are formed by evaporation so that the light emitting element as a whole emits white light.

For instance, an $Alq_3$ film, an $Alq_3$ film partially doped with Nile red which is a red light emitting pigment, an $Alq_3$ film, a p-EtTAZ film, and a TPD (aromatic diamine) film are layered in this order to obtain white light.

On the other hand, when the organic-compound containing layer is formed by application using spin coating, the layer after application is preferably baked by vacuum heating. For example, an aqueous solution of polyethylene dioxythiophene)/poly(styrene sulfonic acid) (PEDOT/PSS) is applied to the entire surface and baked to form a film that works as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is applied to the entire surface and baked to form a film that works as a light emitting layer.

Although the organic compound layer is a laminate in the above example, a single-layer film may be used as the organic compound layer. For instance, a 1,3,4-oxadiazole derivative (PBD) capable of transporting electrons is dispersed in polyvinyl carbazole (PVK) capable of transporting holes. Another method to obtain white light emission is to disperse 30 wt % of PBD as an electron transporting agent and disperse four kinds of pigments (TPB, coumarin 6, DCM1, and Nile red) in appropriate amounts. Also, the organic compound layer may be a laminate of layers of high molecular weight material and layers of low molecular weight materials.

Figure 2A:
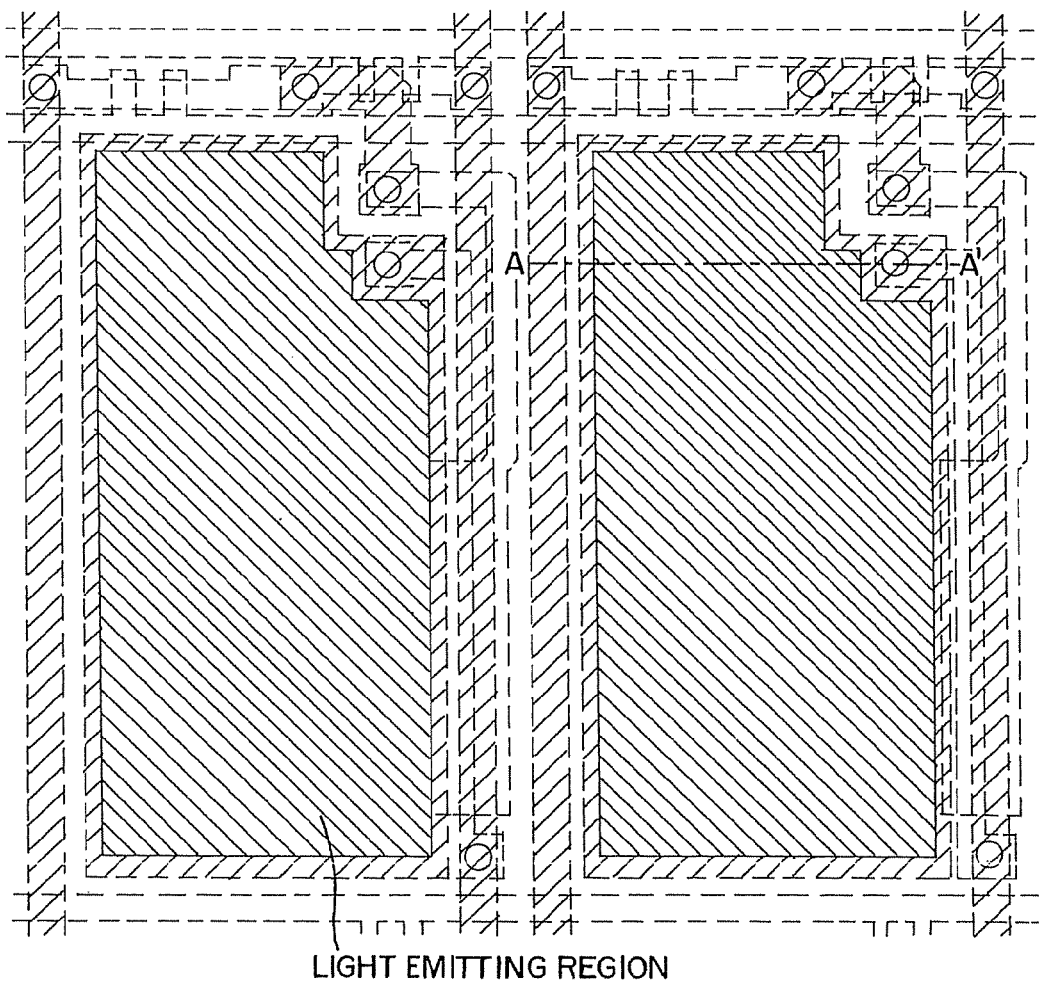
FIGS. 2A and 2B are diagrams showing Embodiment 1.
Figure 2B:
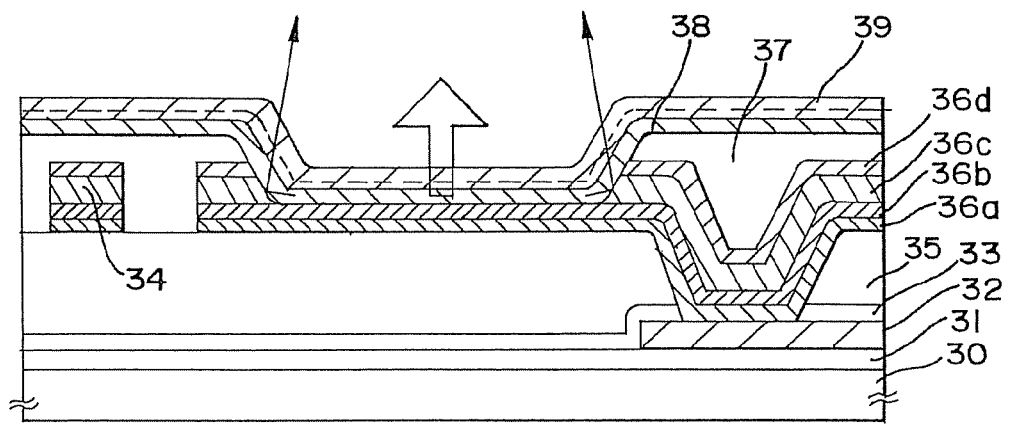

The next step is to form a thin film containing a metal of small function (a film of an alloy such as MgAg, MgIn, AlLi, $CaF_2$, or CaN, or a film formed by co-evaporation of an element belonging to Group 1 or 2 in the periodic table and aluminum) and to form a thin conductive film (an aluminum film here) 39 thereon by evaporation (FIG. 2B). An aluminum film is highly capable of blocking moisture and oxygen and therefore is a preferable material of the conductive film 39 for improvement of the reliability of the light emitting device. FIG. 2B is a sectional view taken along the dot-dash line A-A' in FIG. 2A. This laminate is thin enough to let emitted light pass and functions as the cathode in this embodiment. The thin conductive film may be replaced by a transparent conductive film (such as an ITO (indium oxide-tin oxide alloy) film, an $In_2O_3$—ZnO (indium oxide-zing oxide alloy) film, or a ZnO (zinc oxide) film). On the conductive film 39, an auxiliary electrode may be formed in order to lower the resistance of the cathode. The cathode is formed selectively by resistance heating through evaporation using an evaporation mask.

The thus obtained light emitting element emits white light in the direction indicated by the arrow in FIG. 2B. Light emitted in the lateral direction is reflected by the slope in the layer 36c of the first electrode, thereby increasing the amount of light emitted in the arrow direction.

After the manufacturing process is thus finished up through formation of the second electrode (conductive film 39), the light emitting element formed on the substrate 30 is sealed by bonding a sealing substrate (transparent substrate) using a seal agent. Spacers formed from a resin film may be provided in order to keep the gap between the sealing substrate and the light emitting element. The space surrounded by the seal agent is filled with nitrogen or other inert gas. For the seal agent, an epoxy-based resin is preferred. Desirably, the material of the seal agent transmits as little moisture and oxygen as possible. A substance having an effect of absorbing oxygen and moisture (e.g., drying agent) may be placed in the space surrounded by the seal agent.

By enclosing the light emitting element in a space as above, the light emitting element can be completely cut off from the outside and external substances that accelerate degradation of the organic compound layer, such as moisture and oxygen, can be prevented from entering the light emitting element. Accordingly, a highly reliable light emitting device is obtained.

Embodiment 2

This embodiment describes with reference to FIGS. 6A to 8 an example of a light emitting device in which an auxiliary electrode is formed.

Figure 6A:
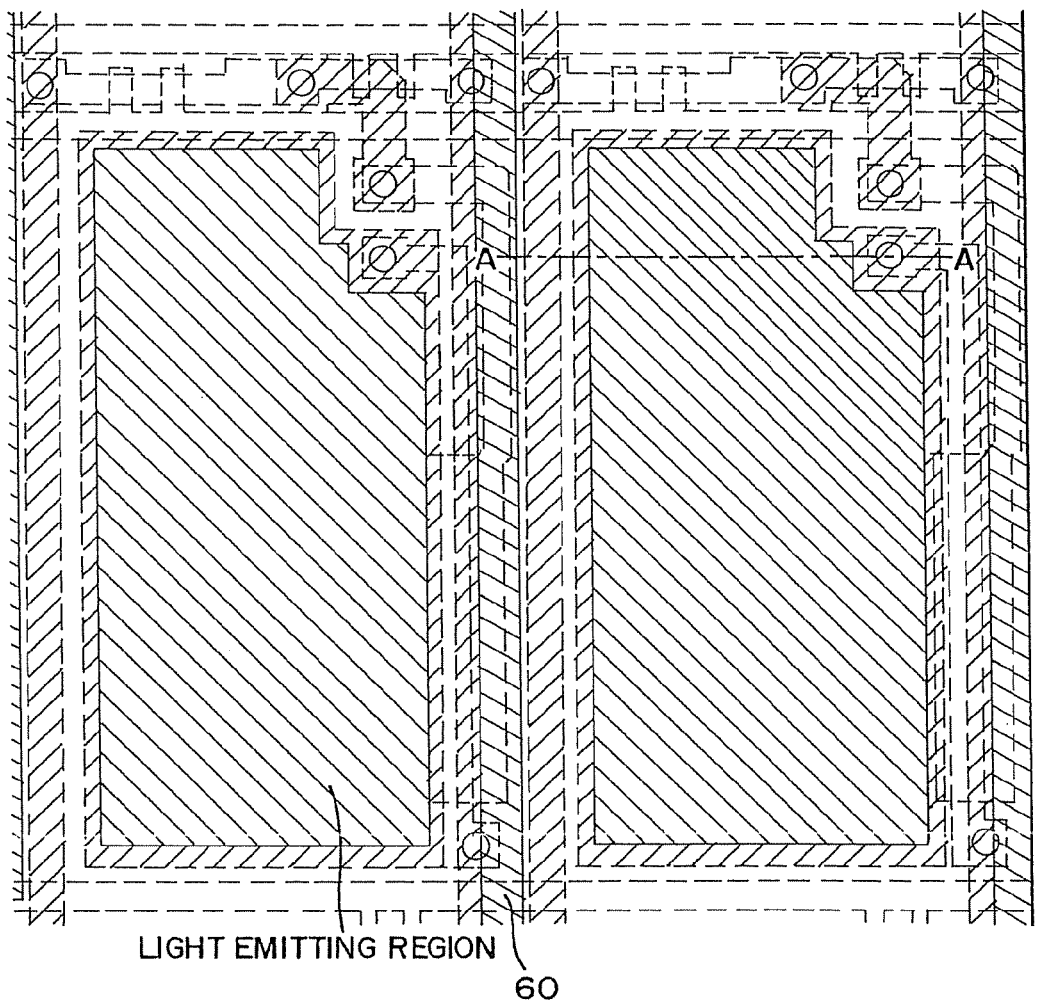
FIGS. 6A and 6B are diagrams showing Embodiment 2.
Figure 6B:
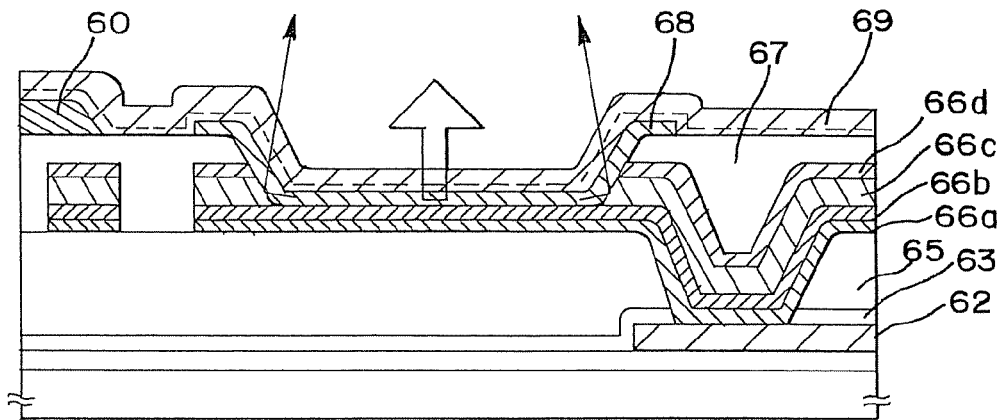

FIG. 6A is a top view of a pixel and a sectional view taken along the dot-dash line A-A' is FIG. 6B.

In this embodiment, steps up through formation of an insulator 67 are identical with those in Embodiment 1 and descriptions thereof are omitted here. The insulator 37 in FIG. 2B corresponds to the insulator 67 in FIG. 6B.

Following the descriptions in Embodiment 1, a base insulating film, a drain region 62, a gate insulating film 63, an interlayer insulating film 65, layers 66a to 66d of a first electrode, and the insulator 67 are formed on a substrate having an insulating surface.

Next, an organic compound-containing layer 68 is selectively formed. This embodiment employs evaporation using an evaporation mask or ink jet to selectively form the organic compound-containing layer 68.

Figure 7:
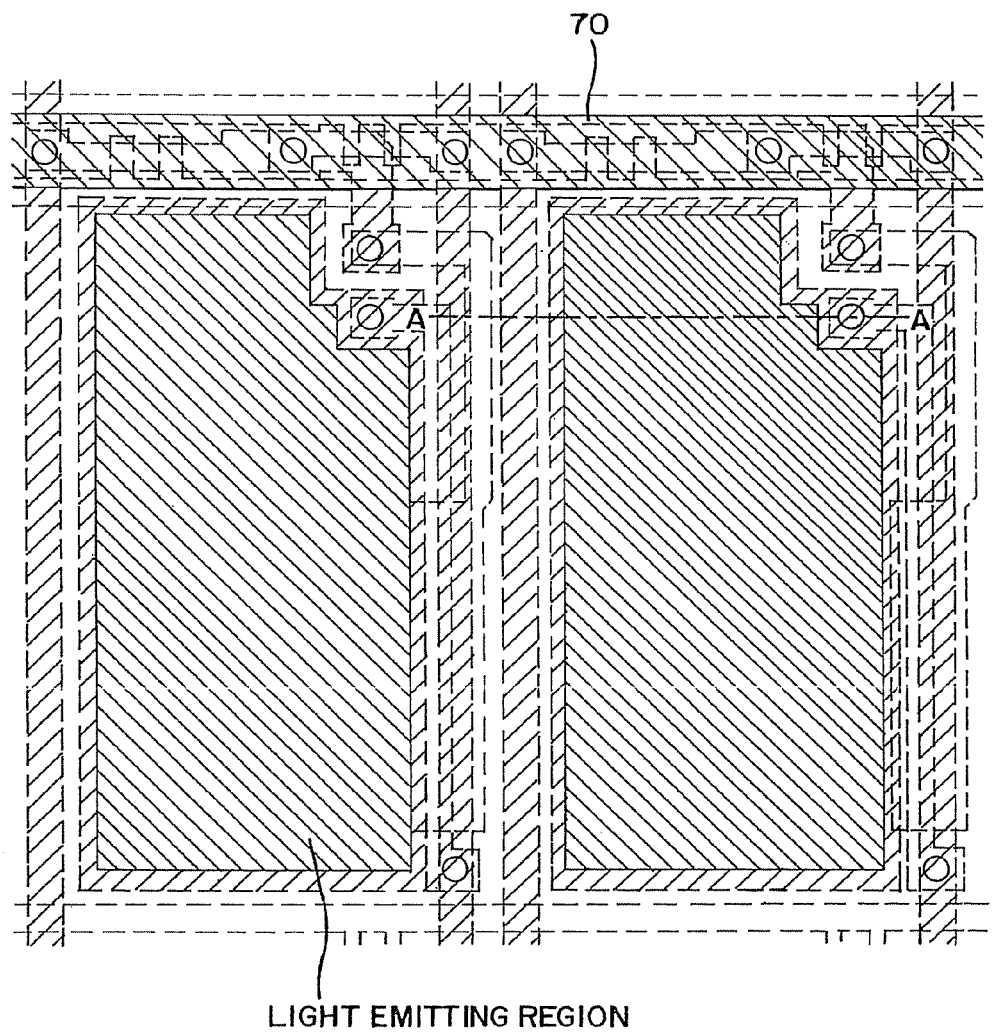
FIG. 7 is a diagram showing Embodiment 2.

Then, an auxiliary electrode 60 is selectively formed on the insulator 67 by evaporation using an evaporation mask. The thickness of the auxiliary electrode 60 is set to 0.2 to 0.5 µm. In the example given in this embodiment, the auxiliary electrode 60 is placed in the direction Y as shown in FIG. 6A. However, arrangement of the auxiliary electrode is not particularly limited and, as shown in FIG. 7, an auxiliary electrode 70 placed in the direction X may be employed. A sectional view taken along the dot-dash line A-A' in FIG. 7 is identical with FIG. 2B.

Figure 8:
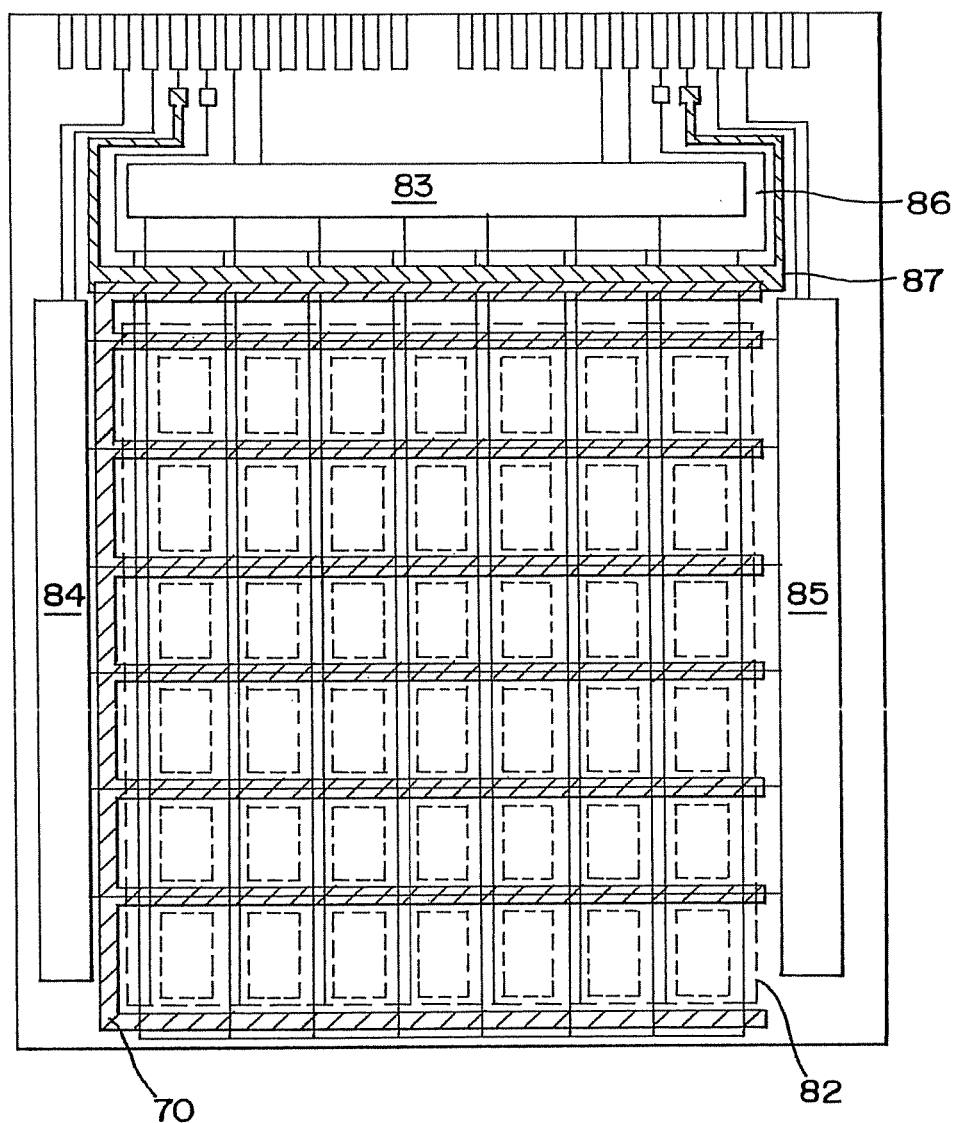
FIG. 8 is a diagram showing Embodiment 2.

FIG. 8 is an exterior diagram of the panel shown in FIG. 7. The auxiliary electrode (auxiliary wire) 70 is led out as shown in FIG. 8 and comes into contact with a lead-out wire 87 in a region between a pixel portion 82 and a source side driving circuit 83. In FIG. 8, reference symbol 82 denotes the pixel portion, 83, the source side driving circuit, 84 and 85, gate side driving circuits, and 86, a power supplying line. The wires that are formed at the same time the first electrode is formed are the power supplying line 86, the lead-out wire 87, and a source wire. In FIG. 8, a terminal electrode for connecting with an FPC is formed at the same time a gate wire is formed.

Similarly to Embodiment 1, the next step is to form a thin film containing a metal of small function (a film of an alloy such as MgAg, MgIn, AlLi, CaF$_2$, or CaN, or a film formed by co-evaporation of an element belonging to Group 1 or 2 in the periodic table and aluminum) and to form a thin conductive film (an aluminum film here) 69 thereon by evaporation. This laminate is thin enough to let emitted light pass and functions as the cathode in this embodiment. The thin conductive film may be replaced by a transparent conductive film (such as an ITO (indium oxide-tin oxide alloy) film, an In$_2$O$_3$—ZnO (indium oxide-zing oxide alloy) film, or a ZnO (zinc oxide) film). In this embodiment, the auxiliary electrode 60 is formed on the insulator 67 such that the auxiliary electrode 60 comes into contact with the conductive film 69 in order to lower the resistance of the cathode.

The thus obtained light emitting element emits white light in the direction indicated by the arrow in FIG. 6B. Light emitted in the lateral direction is reflected by the slope in the layer 66c of the first electrode, thereby increasing the amount of light emitted in the arrow direction.

This embodiment is also applicable to a light emitting device having a large-sized pixel portion since the resistance of the cathode is lowered by forming the auxiliary electrode 60 or 70.

In the example shown in this embodiment, the auxiliary electrode 60 is formed after the organic compound-containing layer 68 is formed. However, in what order they are formed is not particularly limited and the organic compound-containing layer may be formed after the auxiliary electrode 60 is formed.

This embodiment can be combined freely with any one of Embodiment Modes 1 through 3 and Embodiment 1.

Embodiment 3

Further, an exterior view of an active matrix type light emitting apparatus is described with reference to FIG. 9. Further, FIG. 9A is a top view showing the light emitting apparatus and FIG. 9B is a cross-sectional view of FIG. 9A taken along a line A-A'. Reference numeral 901 indicated by a dotted line designates a source signal line driver circuit, numeral 902 designates a pixel portion, and numeral 903 designates a gate signal line driver circuit. Further, numeral 904 designates, a seal substrate, numeral 905 designates a seal agent and an inner side surrounded by the seal agent 905 constitutes a space 907.

Further, reference numeral 908 designates a wiring for transmitting signals inputted to the source signal line driver circuit 901 and the gate signal line driver circuit 903 for receiving a video signal or a clock signal from FPC (flexible printed circuit) 909 for constituting an external input terminal. Further, although only FPC is illustrated here, the FPC may be attached with a printed wiring board (PWB). The light emitting apparatus in the specification includes not only a main body of the light emitting apparatus but also a state in which FPC or PWB is attached thereto.

Next, a sectional structure will be explained in reference to FIG. 9B. Driver circuits and the pixel portion are formed over a substrate 910 and here, the source signal line driver circuit 901 as the driver circuit and the pixel portion 902 are shown.

Further, the source signal line driver circuit 901 is formed with a CMOS circuit combined with an n-channel type TFT 923 and a p-channel type TFT 924. Further, TFT for forming the driver circuit may be formed by a publicly known CMOS circuit, PMOS circuit or NMOS circuit. Further, although according to the embodiment, a driver integrated type formed with the driver circuits over the substrate is shown, the driver integrated type is not necessarily be needed and the driver circuits can be formed not over the substrate but at outside thereof.

Further, the pixel portion 902 is formed by a plurality of pixels each including a switching TFT 911 and a first electrode (anode) 913 electrically connected to a drain thereof.

Further, an insulating layer 914 is formed at both ends of the first electrode (anode) 913, a portion of the first electrode forms a slope along a side of the insulating layer 914. The slope of the first electrode is formed at the same time of a formation of the insulating layer 914. Light generated at a layer containing organic compound 915 is reflected by the slope in order to increase an amount of luminescence in the direction indicated by an arrow in FIG. 9.

The layer containing an organic compound 915 is selectively formed on the first electrode (anode) 913. Further, a second electrode (cathode) 916 is formed over the organic compound layer 915. Thereby, a light emitting element 918 comprising the first electrode (anode) 912, the organic compound layer 915 and the second electrode (cathode) 916 is formed. Here, the light emitting element 918 shows an example of white color luminescence and therefore, provided with the color filter comprising a coloring layer 931 and BM932 (for simplification, overcoat layer is not illustrated here).

A third electrode (an auxiliary electrode) 917 which is a part of a structure shown in Embodiment 2 is formed on the insulating layer 914 to realize that the second electrode has a lower resistance. The second electrode (cathode) 916 functions also as a wiring common to all the pixels and electrically connected to FPC 909 via the third electrode 917 and the connection wiring 908.

Further, in order to seal the light emitting element 918 formed over the substrate 910, the seal substrate 904 is pasted by the seal agent 905. Further, a spacer comprising a resin film may be provided for ensuring an interval between the seal substrate 904 and the light emitting element 918. Further, the space 907 on the inner side of the seal agent 905 is filled with an inert gas of nitrogen or the like. Further, it is preferable to use epoxy species resin for the seal agent 905. Further, it is preferable that the seal agent 905 is a material for permeating moisture or oxygen as less as possible. Further, the inner portion of the space 907 may be included with the substance having an effect of absorbing oxygen of water.

Further, according to this embodiment, as a material for constituting the seal substrate 904, other than glass substrate or quartz substrate, a plastic substrate comprising FRP (Fiberglass-Reinforced Plastics), PVF (polyvinyl fluoride), Mylar, polyester or acrylic resin can be used. Further, it is possible to adhere the seal substrate 904 by using the seal agent 905 and thereafter seal to cover a side face (exposed face) by a seal agent.

By sealing the light emitting element in the space 907 as described above, the light emitting element can completely be blocked from outside and a substance for expediting to deteriorate the organic compound layer such as moisture or oxygen can be prevented from invading from outside. Therefore, the highly reliable light emitting apparatus can be provided.

Further, this embodiment can freely be combined with Embodiment Modes 1 to 3, and Embodiments 1, 2.

Embodiment 4

By implementing the present invention, all of electronic apparatus integrated with a module having an organic light emitting element (active matrix type EL module) are completed.

As such electronic apparatus, a video camera, a digital camera, a head mount display (goggle type display), a car navigation apparatus, a projector, a car stereo, a personal computer, a portable information terminal (mobile computer, portable telephone or electronic book) and the like are pointed out. FIGS. 10 and 11 show examples of these.

Figure 10A:
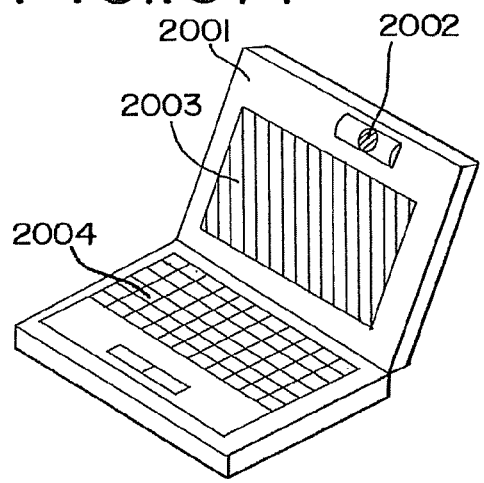
FIGS. 10A to 10F are diagrams showing examples of electronic equipment.

FIG. 10A is a personal computer which includes a main body 2001, an image input portion 2002, a display portion 2003 and a keyboard 2004.

Figure 10B:
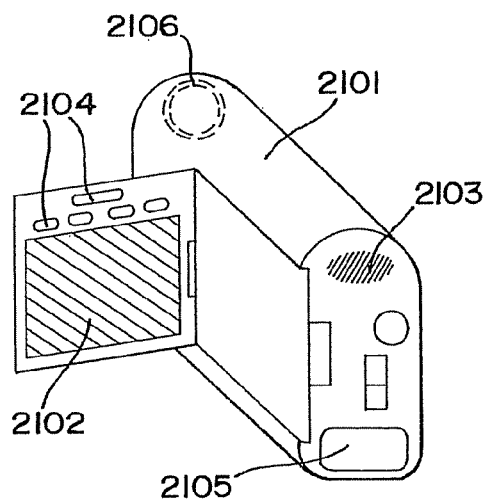

FIG. 10B is a video camera which includes a main body 2101, a display portion 2102, a voice input portion 2103, an operation switch 2104, a battery 2105, an image receiving portion 2106.

Figure 10C:
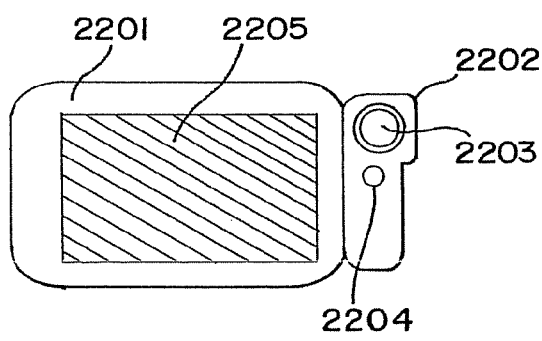

FIG. 10C is a mobile computer which includes a main body 2201, a camera portion 2202, an image receiving portion 2203, an operation switch 2204 and a display portion 2205.

Figure 10D:
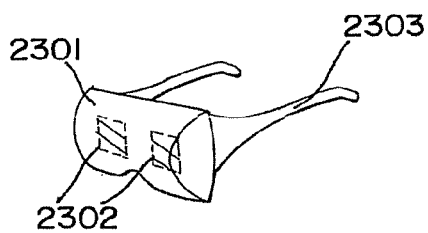

FIG. 10D is a goggle type display which includes a main body 2301, a display portion 2302 and an arm portion 2303.

Figure 10E:
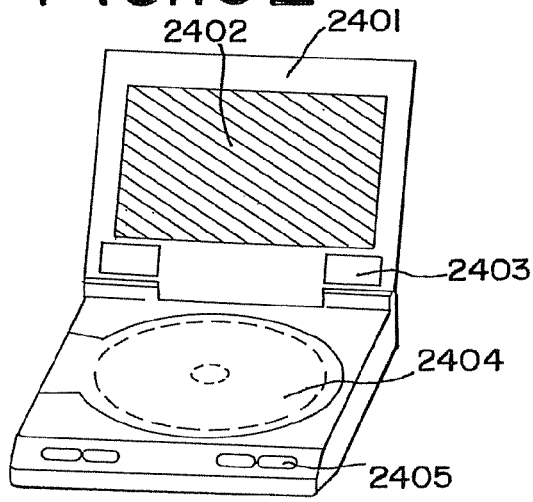

FIG. 10E is a player using a record medium recorded with programs (hereinafter, referred to as record medium) which includes a main body 2401, a display portion 2402, a speaker portion 2403, a record medium 2404 and an operation switch 2405. Further, the player uses DVD (Digital Versatile Disc) or CD as a record medium and can enjoy music, enjoy movie and carry out the game or Internet.

Figure 10F:
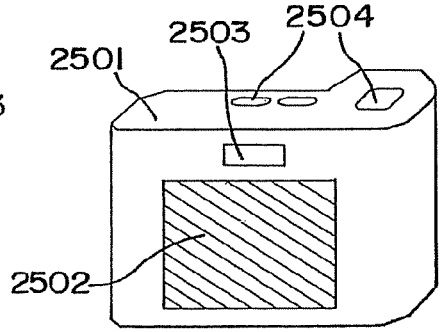

FIG. 10F is a digital camera which includes a main body 2501, a display portion 2502, an eye-piece portion 2503, an operation switch 2504 and an image receiving portion (not illustrated).

Figure 11A:
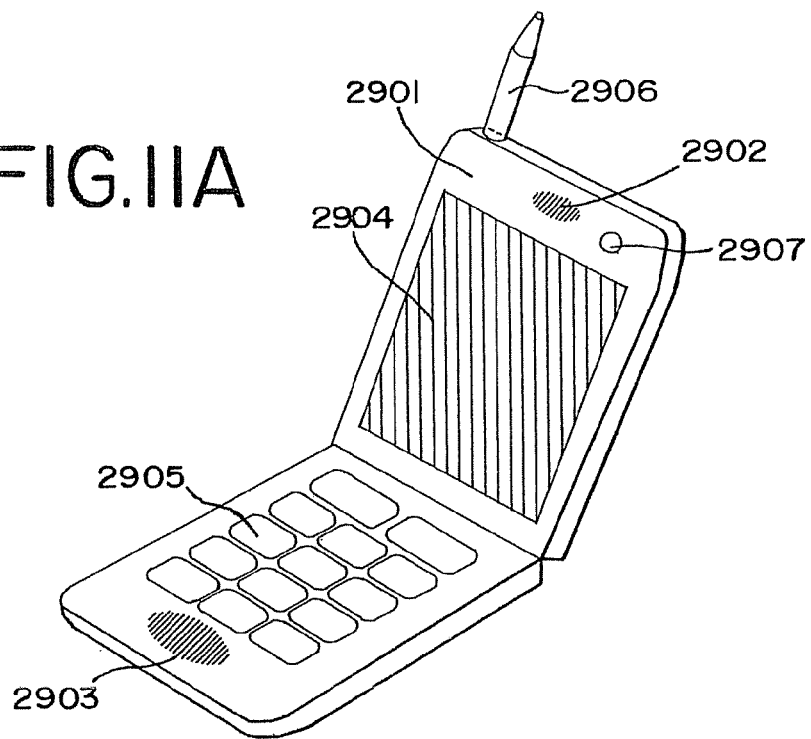
FIGS. 11A to 11C are diagrams showing examples of electronic equipment.

FIG. 11A is a portable telephone which includes a main body 2901, a voice output portion 2902, a voice input portion 2903, a display portion 2904, an operation switch 2905, an antenna 2906 and an image input portion (CCD, image sensor) 2907.

Figure 11B:
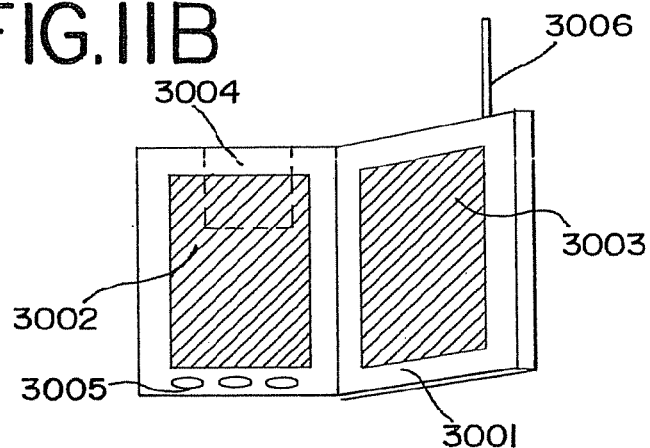

FIG. 11B is a portable book (electronic book) which includes a main body 3001, display portions 3002, 3003, a record medium 3004, an operation switch 3005, an antenna 3006.

Figure 11C:
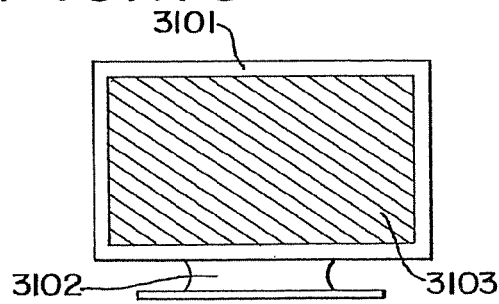
Figure 13:
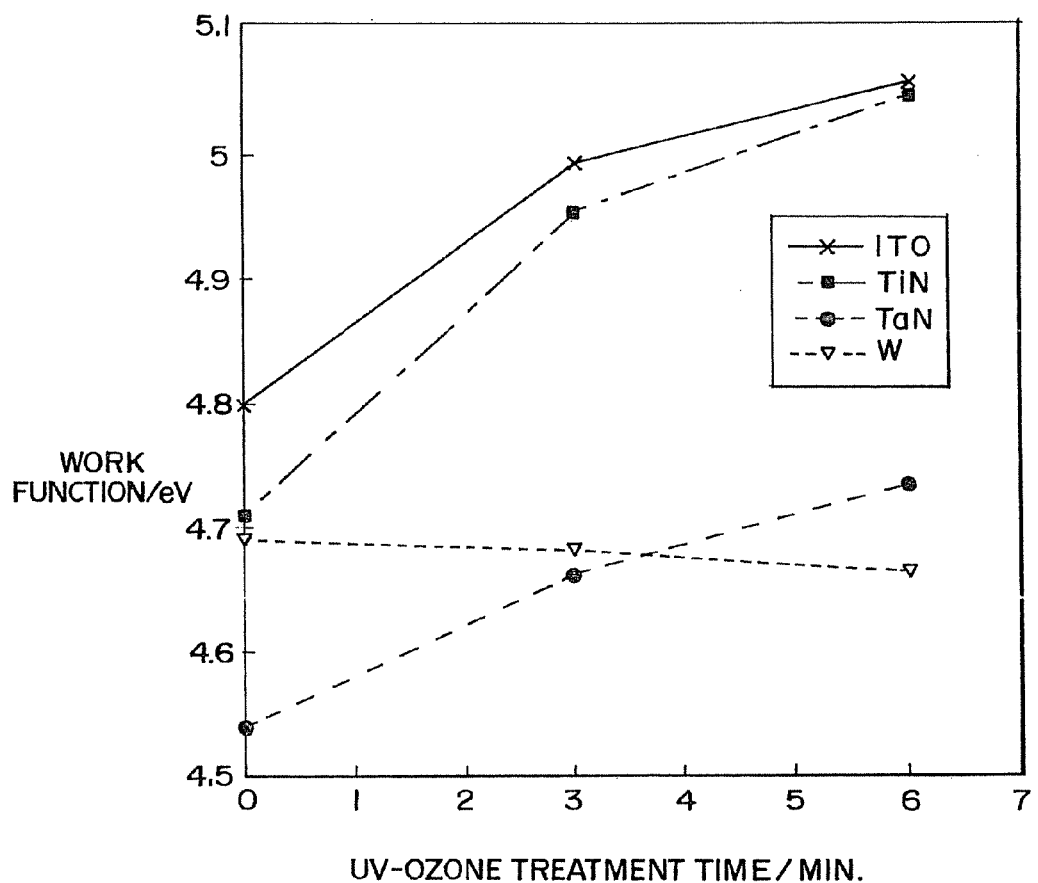
FIG. 13 is a graph showing changes in work function with UV-ozone treatment time.

FIG. 11C is the display which includes a main body 3101, a support base 3102 and a display portion 3103.

Incidentally, the display shown in FIG. 11C is of a screen size of middle or small type or large type, for example, a screen size of 5 to 20 inches. Further, in order to form the display portion of this size, it is preferable to use a display portion having a side of a substrate of 1 m and carry out mass production by taking many faces. In case that the screen having a size of middle or small type or large type is formed, it is preferable that the auxiliary electrode shown in Embodiment 2 or Embodiment 3 is formed.

As described above, a range of applying the invention is extremely wide and is applicable to a method of fabricating electronic apparatus of all the fields. Further, the electronic apparatus of the embodiment can be realized by using a constitution comprising any combination of Embodiment Modes 1 to 3 and Embodiments 1 to 3.

According to the present invention, a portion of light emitted from an organic compound-containing layer that is emitted in the lateral direction (the direction parallel to the substrate face) is reflected by a slope formed in a stepped portion of a first electrode to thereby increase the total amount of light taken out in a certain direction (a direction in which light passes the second electrode). In short, a light emitting device with less stray light and other types of light emission loss can be obtained.

Furthermore, the structure of the present invention requires fewer masks in total in its manufacture process.

What is claimed is:

1. A light emitting device comprising:
a first electrode connected to a thin film transistor over a first substrate, wherein the first electrode has a depression portion;
an insulator covering the first electrode except the depression portion;
a layer comprising an organic material over the first electrode and the insulator;
a second electrode over the layer comprising the organic material; and
a second substrate over the second electrode,
wherein the first electrode in the center of the depression portion is thinner than the first electrode in an edge of the depression portion,
wherein the first electrode has a multi-layer structure comprising a first conductive layer and a second conductive layer over the first conductive layer,
wherein the layer comprising the organic material is in contact with a top surface of the first conductive layer and a side surface of the second conductive layer, and
wherein the layer comprising the organic material is capable of emitting white light.

2. A light emitting device comprising:
a first electrode connected to a thin film transistor over a first substrate, wherein the first electrode has a depression portion;
an insulator covering the first electrode except the depression portion;
a layer comprising an organic material over the first electrode and the insulator;
a second electrode over the layer comprising the organic material; and
a second substrate over the second electrode,
wherein the first electrode has a multi-layer structure comprising a first conductive layer containing titanium and a second conductive layer containing aluminum,
wherein the second conductive layer is over the first conductive layer,
wherein the layer comprising the organic material is in contact with a to surface of the first conductive layer and a side surface of the second conductive layer, and
wherein the layer comprising the organic material is capable of emitting white light.

3. The light emitting device according to claim 2, wherein the first electrode further comprises a third conductive layer containing titanium nitride or tungsten nitride and a fourth conductive layer containing titanium nitride.

4. The light emitting device according to claim 2, wherein the number of layers of the multi-layer structure in the depression portion is smaller than the number of layers of the multi-layer structure outside the depression portion.

5. The light emitting device according to claim 1, wherein the depression portion has a sloped surface.

6. The light emitting device according to claim 2, wherein the depression portion has a sloped surface.

7. The light emitting device according to claim 5, wherein the angle of inclination of the sloped surface of the depression portion is more than 30° and less than 70°.

8. The light emitting device according to claim 6, wherein the angle of inclination of the sloped surface of the depression portion is more than 30° and less than 70°.

9. The light emitting device according to claim 1, wherein the second electrode is a light-transmitting film comprising a metal.

10. The light emitting device according to claim 2, wherein the second electrode is a light-transmitting film comprising a metal.

11. The light emitting device according to claim 1, wherein the second substrate is provided with a colored layer.

12. The light emitting device according to claim 2, wherein the second substrate is provided with a colored layer.

13. An electronic equipment including the light emitting device according to claim 1.

14. An electronic equipment including the light emitting device according to claim 2.

15. A light emitting device comprising:
a first electrode connected to a thin film transistor over a first substrate, wherein the first electrode includes a first portion and a second portion;
an insulator covering the second portion of the first electrode wherein the first portion of the first electrode is not covered by the insulator;
a light emitting layer comprising an organic material over the first electrode and the insulator;
a second electrode over the light emitting layer comprising the organic material; and
a second substrate over the second electrode,
wherein the first electrode has a multi-layer structure comprising a first conductive layer and a second conductive layer over the first conductive layer,
wherein the layer comprising the organic material is in contact with a top surface of the first conductive layer and a side surface of the second conductive layer, and
wherein the first portion of the first electrode is thinner than the second portion of the first electrode.

16. The light emitting device according to claim 15 wherein the first conductive layer is overlapped with the second conductive layer in the second portion while the first conductive layer is not overlapped with the second conductive layer in the first portion.

17. The light emitting device according to claim 15 wherein the light emitting layer comprising the organic material is capable of emitting white light.

18. The light emitting device according to claim 1, wherein the first conductive layer contains titanium and the second conductive layer contains aluminum.

19. The light emitting device according to claim 15, wherein the first conductive layer contains titanium and the second conductive layer contains aluminum.

* * * * *

UNITED STATES PATENT AND TRADEMARK OFFICE
CERTIFICATE OF CORRECTION

PATENT NO. : 8,519,619 B2  
APPLICATION NO. : 13/234416  
DATED : August 27, 2013  
INVENTOR(S) : Shunpei Yamazaki, Satoshi Seo and Hideaki Kuwabara Page 1 of 1

It is certified that error appears in the above-identified patent and that said Letters Patent is hereby corrected as shown below:

In the Specification:

Column 2, Line 3; Change "with ITT on" to --with TFT on--.
Column 9, Line 54; Change "being transparent 10 visible" to --being transparent to visible--.

In the Claims:

Column 20, Line 43, Claim 2; Change "with a to surface of the" to --with a top surface of the--.

Signed and Sealed this
Tenth Day of December, 2013

Margaret A. Focarino
*Commissioner for Patents of the United States Patent and Trademark Office*